United States Patent
Deng

(10) Patent No.: US 8,670,265 B2
(45) Date of Patent: Mar. 11, 2014

(54) REDUCING POWER IN SRAM USING SUPPLY VOLTAGE CONTROL

(75) Inventor: Xiaowei Deng, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 86 days.

(21) Appl. No.: 13/461,130

(22) Filed: May 1, 2012

(65) Prior Publication Data

US 2013/0294149 A1 Nov. 7, 2013

(51) Int. Cl.
*G11C 11/00* (2006.01)

(52) U.S. Cl.
USPC .......................................................... 365/156

(58) Field of Classification Search
USPC ............ 365/154, 156, 189.09, 226, 227, 203, 365/189.05
See application file for complete search history.

(56) References Cited

U.S. PATENT DOCUMENTS

| | | | | |
|---|---|---|---|---|
| 5,848,428 A | * | 12/1998 | Collins | 711/127 |
| 7,006,370 B1 | * | 2/2006 | Ramesh et al. | 365/63 |
| 7,773,407 B2 | | 8/2010 | Huang et al. | |
| 8,325,511 B2 | * | 12/2012 | Seshadri | 365/154 |
| 8,379,465 B2 | * | 2/2013 | Clinton et al. | 365/189.11 |
| 2008/0151605 A1 | | 6/2008 | Goel | |
| 2010/0124099 A1 | | 5/2010 | Wu et al. | |
| 2011/0261609 A1 | | 10/2011 | Seshadri | |
| 2011/0261632 A1 | | 10/2011 | Clinton et al. | |

* cited by examiner

*Primary Examiner* — Gene Auduong
(74) *Attorney, Agent, or Firm* — John R. Pessetto; W. James Brady; Frederick J. Telecky, Jr.

(57) ABSTRACT

An embodiment of the invention provides a method for decreasing power in a static random access memory (SRAM). A first voltage is applied between latch sourcing and latch sinking supply lines for columns of memory cells that are column addressed during a read cycle. A second voltage is applied between latch sourcing and latch sinking supply lines for columns of memory cells that are not column addressed during a read cycle. Because the second voltage is less than the first voltage, power in the SRAM is reduced. In this embodiment, a memory cell in the SRAM includes at least one read buffer and a latch connected between the latch sourcing and latch sinking supply lines.

27 Claims, 14 Drawing Sheets

REDUCING POWER IN SRAM USING SUPPLY VOLTAGE CONTROL

BACKGROUND

This invention relates to integrated circuits, particularly to static random access memory (SRAM) devices, in either embedded form or stand alone (i.e. discrete) form.

As integrated circuits (ICs) become physically larger and more complex, the amount of power used by an IC increases. Power consumption in an IC may increase for several reasons. For example, the frequency at which an IC switches consumes power by charging and discharging capacitance on the IC. Increasing the switching frequency increases the power consumed on an IC. Power may also be consumed due to DC (direct current) conditions such as leakage in transistors and voltage dropped across resistors.

Power reduction may be achieved by reducing power supply voltages provided to the IC. For example, the voltage applied to an SRAM (Static Random Access Memory) may be reduced when the SRAM is not being accessed. Power may also be reduced by reducing the switching frequency. For example, in some circumstances a clock that is used to switch a particular circuit may be shut off or its frequency may be reduced.

Power reduction is particularly important in the design of DSP (Digital Signal Processor) ICs with large memory arrays. The power used by large memory arrays may be reduced by putting them into a "sleep" mode or a "retain" mode where the voltage applied to the array is reduced. However, it is important to manage when and how long large memory arrays are in the sleep mode. When large memory arrays are put into the sleep mode and taken out of the sleep mode too often, switching power is used that can negate the power saved by putting the large memory arrays in the sleep mode.

Power reduction is important in order to reduce the heating of an integrated circuit. Reducing the heating of an integrated circuit can lower the cost of packaging for an integrated circuit.

DETAILED DESCRIPTION

The drawings and description, in general, disclose a method and circuits for decreasing power used in an SRAM in an integrated circuit. The SRAM can be an embedded memory (where the memory is connected to other circuits on the same chip) or stand alone (i.e. discrete) memory (where the whole chip is an SRAM).

In one embodiment, power is reduced in an array of memory cells in the SRAM by applying a first voltage between the latch sourcing and latch sinking supply lines of the memory cells that are column addressed (i.e. selected) during a read cycle of the array while applying a second voltage between the latch sourcing and latch sinking supply lines of the memory cells that are not column addressed during the read cycle of the array. In this embodiment, the first voltage is higher than the second voltage to enable a memory cell in the addressed column to be read. The second voltage can be lower than the first voltage because memory cells in the unaddressed columns are not being read. Because a lower voltage may be used to maintain the logical state of the memory cells in the unaddressed columns, power may be reduced when compared to maintaining the unaddressed columns at the first voltage.

In another embodiment, power is reduced in an array of memory cells in the SRAM by applying a first voltage between the latch sourcing and latch sinking supply lines of the memory cells that are column addressed (i.e. selected) during a write cycle of the array while applying a second voltage between the latch sourcing and latch sinking supply lines of the memory cells that are not column addressed during the write cycle of the array. In this embodiment, the first voltage is lower than the second voltage because a memory cell in an addressed row and an addressed column does not require as high a voltage when the memory cell is written. The second voltage is higher than the first voltage because a memory cell in an unaddressed column requires a higher voltage in order to maintain the logical state of the memory cell. Because a lower voltage may be used to the addressed columns, power may be reduced when compared to maintaining the addressed columns at the second voltage.

These two embodiments along with other embodiments of the invention will be explained in more detail later in the specification.

Figure 1A:
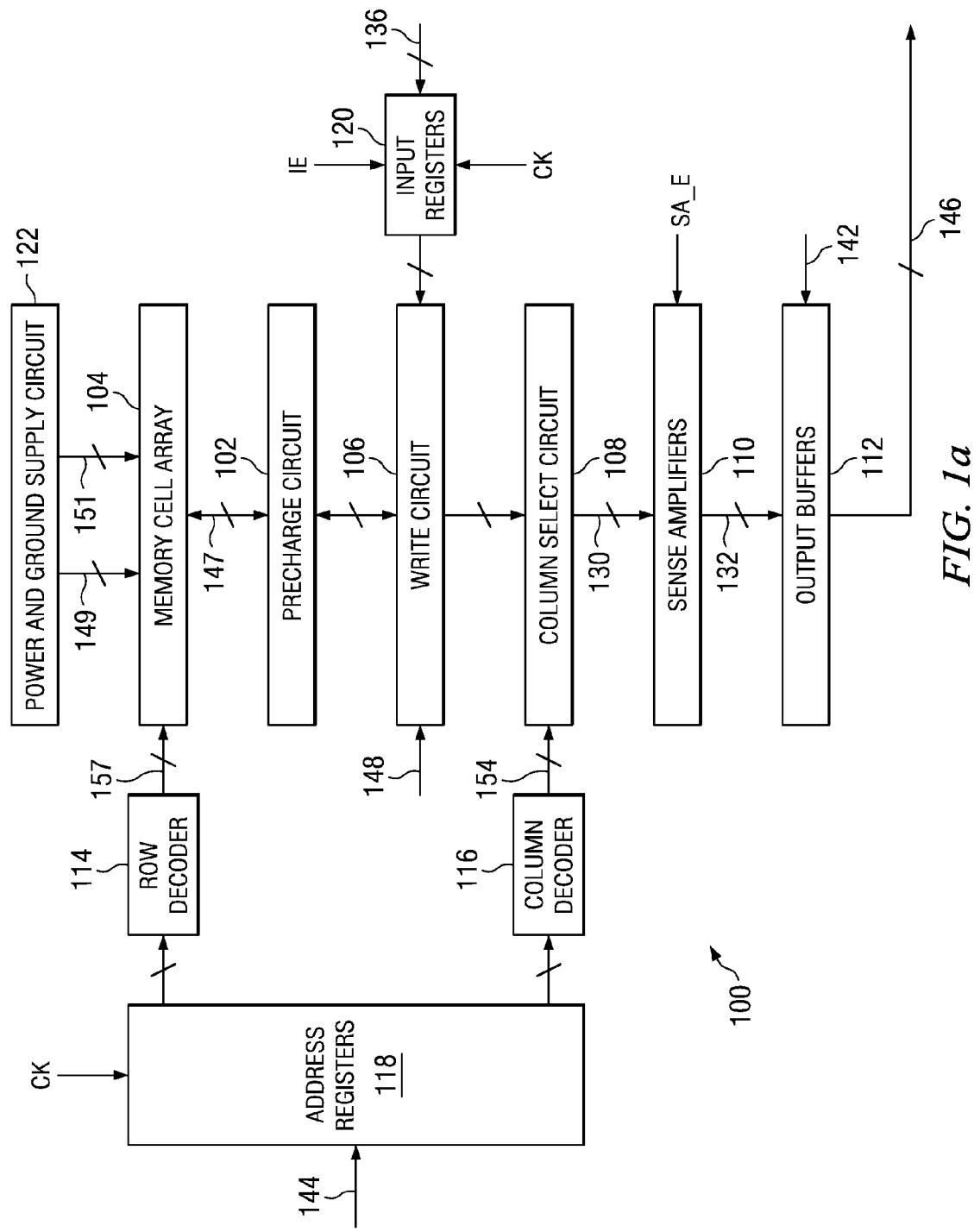
FIG. 1a is a block diagram of an SRAM (Static Random Access Memory) according to an embodiment of the invention.

FIG. 1a is a block diagram of an SRAM (Static Random Access Memory) 100 according to an embodiment of the invention. In this embodiment only a single memory cell array 104 is shown for illustrative purposes. Typically, an SRAM has more than one memory cell array. In this example, a pre-charge circuit 102 pre-charges the bit lines 147 in the memory cell array 104 to a predetermined voltage before the memory cell array 104 is either read from or written to. Power (i.e. sourcing supply) and ground (i.e. sinking supply) are provided to the memory cell array 104 by the power and ground supply circuit 122. The power and ground supply circuit 122 provides power and ground supply voltages to the power (sourcing supply) lines 149 and ground (sinking supply) lines 151 in the array.

When the memory cell array 104 is read from, an address 144 is input to the address registers 118. The address 144 stored in the address registers 118 is then clocked by a clock signal CK from the address registers to a row decoder 114 and a column decoder 116. In this example, the row decoder 114 drives a word line selected from the word lines 157 in the memory cell array 104 to a logical high value. Memory cells attached to the selected word line provide data that is passed through the pre-charge circuit 102 and the write circuit 106 to the column select circuit 108. The column select circuit 108 selects what data 130 is provided to the sense amplifiers 110 based on the output 154 of the column decoder 116. The sense amplifiers 110 increase the voltage of the selected data 130 when the sense amplifiers are enabled by signal SA_E. The amplified signals 132 are sent to the output buffers 112. The output buffers 112 retain the amplified signals 132. When the output enable signal 142 is active, the output buffers 112 send the stored data 146 in the output buffers 112 from the SRAM 100 to other circuits.

When the memory cell array 104 is written to, an address 144 is input to the address registers 118 and the write enable signal 148 is activated. The address 144 stored in the address registers 118 is then clocked by a clock signal CK from the address registers to a row decoder 114 and a column decoder 116. In this example, the row decoder 114 drives a word line selected from the word lines 157 in the memory cell array 104 to a logical high value. The selected word line along with the selected bit lines determine which memory cells in the memory cell array 104 will be written to. The input enable signal IE allows data 136 previously stored in the input registers 120 to be written into the memory cell array 104.

Figure 1B:
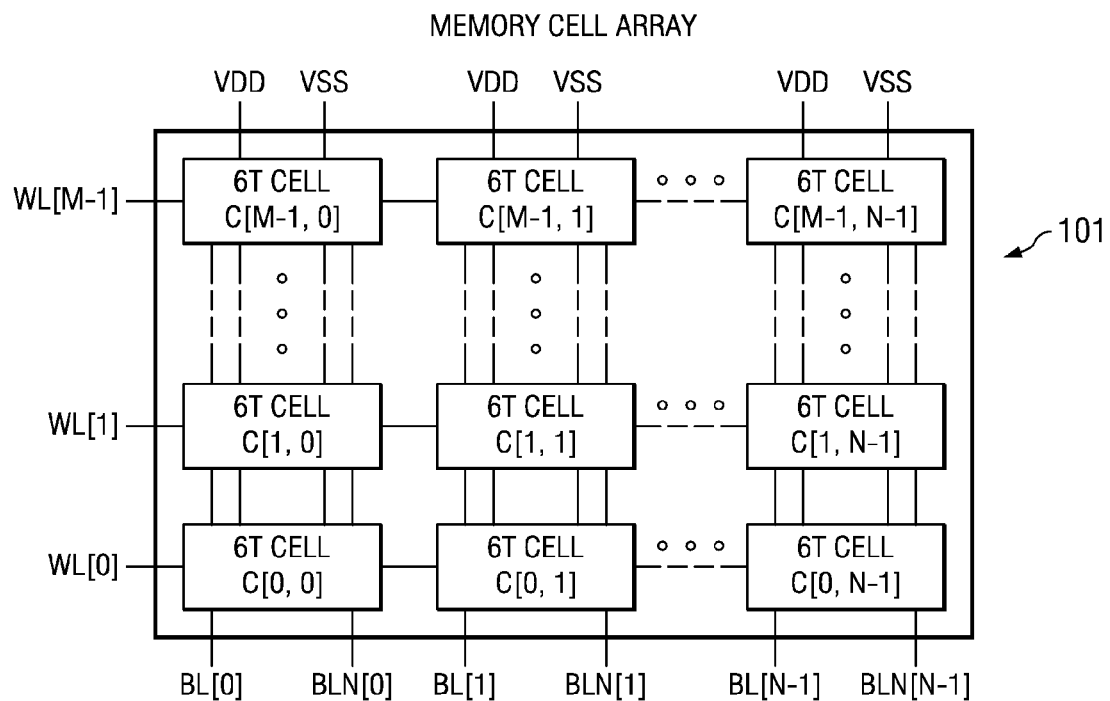
FIG. 1b is a block diagram of a memory cell array with six-transistor memory cells. (Prior Art)

FIG. 1b is a block diagram of a memory cell array 101 with six-transistor memory cells, C[0,0]-C[M−1,N−1]. In this example, power and ground are provided to the 6 transistor memory cells C[0,0]-C[M−1,N−1] by voltage supplies VDD and VSS. Data is written to and read from the memory cell array 101 using word lines WL[0]-WL[M−1] and bit lines BL[0]-BL[N−1] and BLN[0]-BLN[N−1].

Figure 1C:
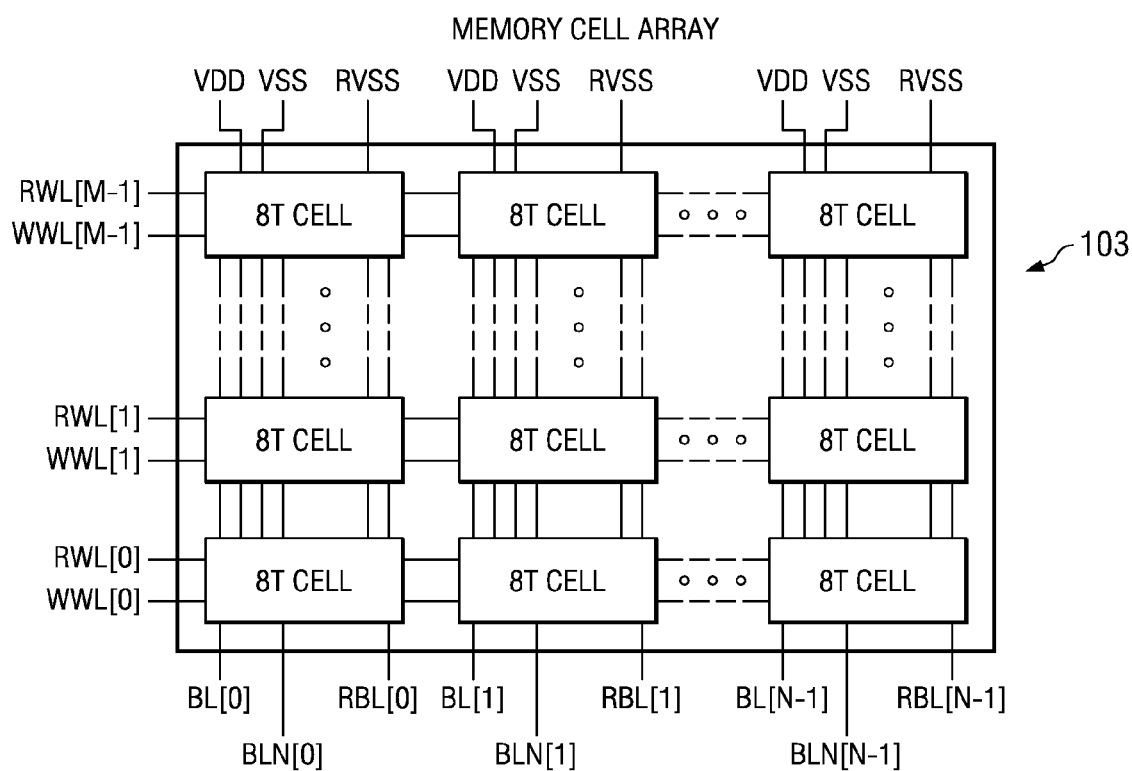
FIG. 1c is a block diagram of a memory cell array with eight-transistor memory cells. (Prior Art)

FIG. 1c is a block diagram of a memory cell array 103 with eight-transistor memory cells, C[0,0]-C[M−1,N−1]. In this example, power and ground are provided to the eight transistor memory cells C[0,0]-C[M−1,N−1] by voltage supplies VDD, VSS and RVSS. Data is written to the memory cell array 101 using write word lines WWL[0]-WWL[M−1] and write bit lines BL[0]-BL[N−1] and BLN[0]-BLN[N−1]. Data is read from the memory cell array 101 using read word lines RWL[0]-RWL[M−1] and read bit lines RBL[0]-RBL[N−1].

Figure 2:
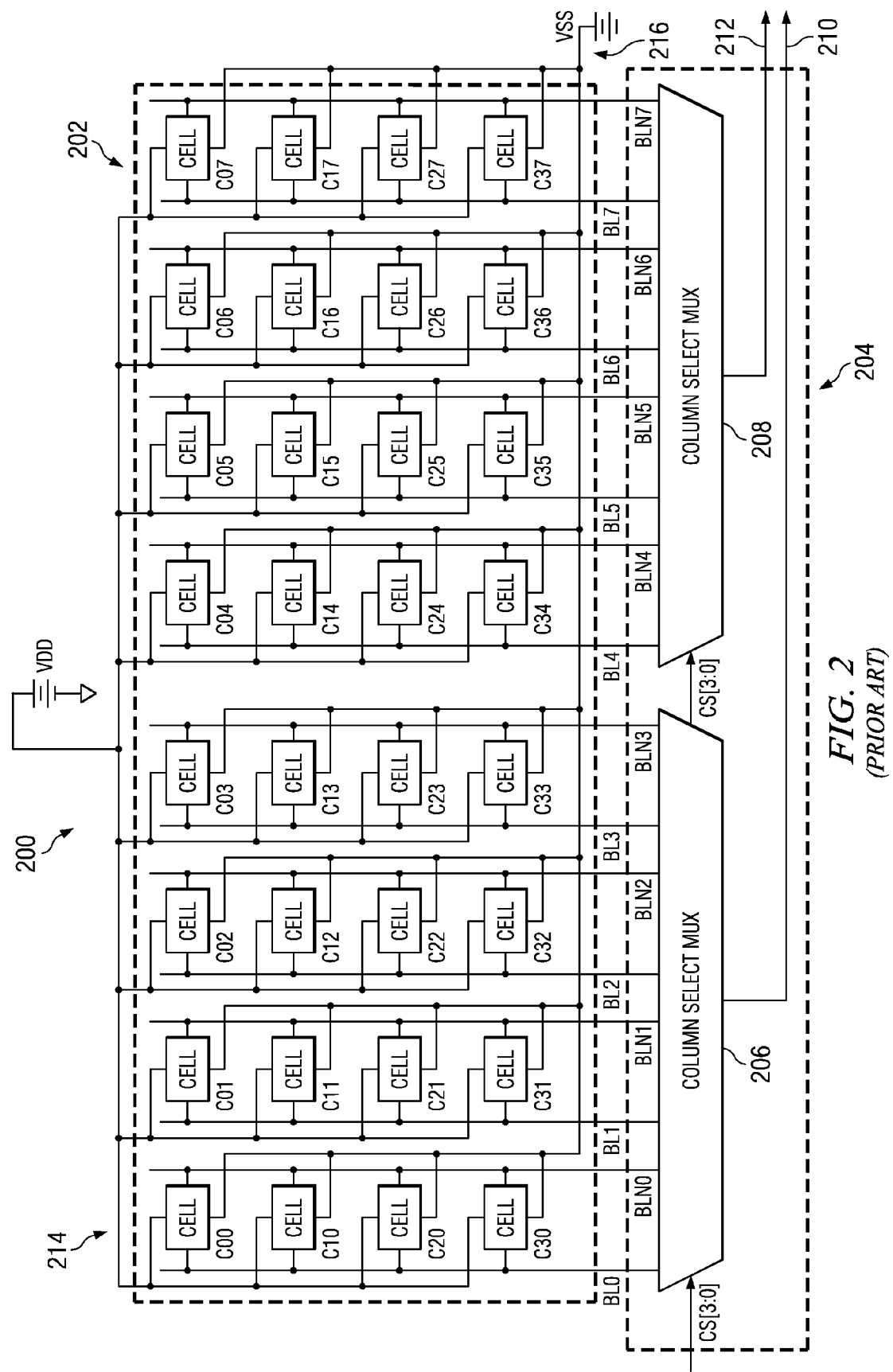
FIG. 2 is a block diagram of an SRAM interleaved memory cell array and column select circuit. (Prior Art)

FIG. 2 is a block diagram of a portion of an SRAM interleaved memory cell array 202 and column select circuit 204. In this example, a portion of an interleaved memory array 202 and a portion of a column select circuit 204 are used to illustrate how data is interleaved in a memory cell array and how power and ground are supplied to memory cells in a memory cell array. In this example, a sourcing voltage supply VDD is applied to a latch sourcing supply line 214. The latch sourcing supply line 214 is attached to all of the memory cells C00-C37. In this example, a sinking voltage supply VSS is applied to a latch sinking supply line 216. The latch sinking supply line 216 is attached to all of the memory cells C00-C37. In this example, the voltage supplies VDD and VSS remain constant. In this example, memory cells C00-C30 are connected to bit line pairs BL0 and BLN0. Memory cells C01-C31 are connected to bit line pairs BL1 and BLN1. Memory cells C02-C32 are connected to bit line pairs BL2 and BLN2. Memory cells C03-C33 are connected to bit line pairs BL3 and BLN3. Memory cells C04-C34 are connected to bit line pairs BL4 and BLN4. Memory cells C05-C35 are connected to bit line pairs BL5 and BLN5. Memory cells C06-C36 are connected to bit line pairs BL6 and BLN6. Memory cells C07-C37 are connected to bit line pairs BL7 and BLN7. Word lines are not shown in FIG. 2 for the sake of clarity.

In the example shown in FIG. 2, bit line pairs BL0-BL3 and BLN0-BLN3 are electrically connected to a 4:1 column select multiplexer 206. Bit line pairs BL4-BL7 and BLN4-BLN7 are electrically connected to a 4:1 column select multiplexer 208. Column select multiplexer 206 selects one pair of bit lines from four pairs of bit lines to the output 210 based on the column select signal CS[3:0]. Column select multiplexer 208 selects one pair of bit lines from four pairs of bit lines to the output 212 based on the column select signal CS[3:0]. Selecting bit lines in this manner is often called interleaving. Interleaving allows larger periphery circuits such as sense amplifiers and column input/output to be easily pitch-matched with the memory cell array in layout. Interleaving when used with ECC (error correction codes) can significantly reduce the number of multi-bit failures in a word due to soft errors (e.g. alpha particle strikes). Correcting a multi-bit failure in a word requires a much more complicated ECC circuit than correcting a single-bit failure in a word.

Figure 3:
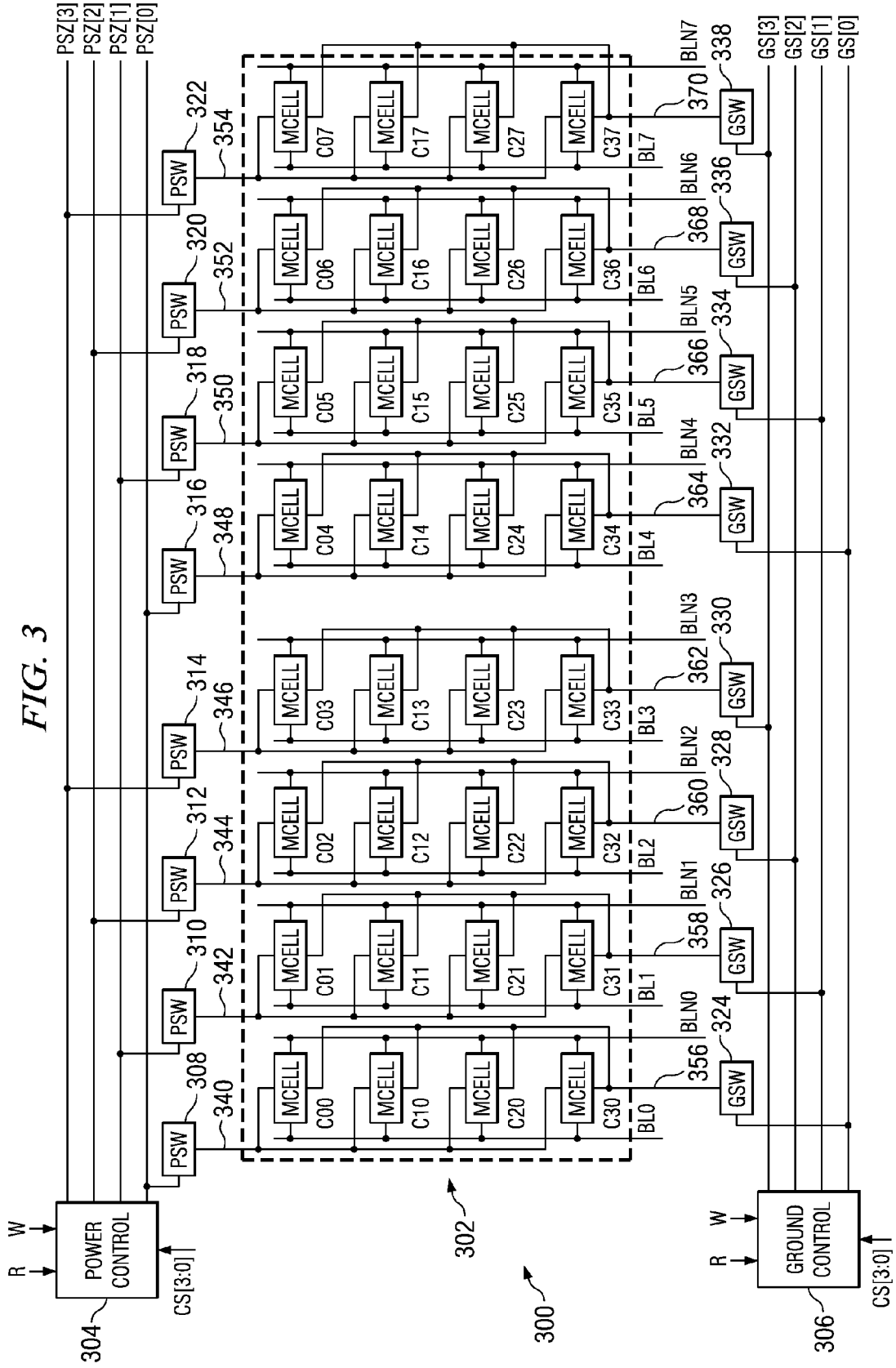
FIG. 3 is a block diagram of an SRAM interleaved memory cell array with voltage supply control according to an embodiment of the invention.

FIG. 3 is a block diagram of an SRAM interleaved memory cell array 302 with power control and ground control according to an embodiment of the invention. In an embodiment of the invention, the voltages applied to the latch sourcing supply lines 340-354 and the voltages applied to the latch sinking supply lines 356-370 may be varied individually based on whether a column is addressed and whether a column is being read or written. The voltages applied to the latch sourcing supply lines 340-354 and the latch sinking supply lines 356-370 are provided by the power switches PSW 308-322 and by the ground switches GSW 324-338, respectively.

In a first embodiment, the control for the power switches PSW 308-322 is provided by a power control circuit 304. The power control circuit 304 uses the column select signals CS[3:0], the read signal R and the write signal W as inputs and provides four power select output signals PSZ[3:0]. Also in this first embodiment, the control for the ground switches GSW 324-338 is provided by a ground control circuit 306. The ground control circuit 306 uses the column select signals CS[3:0], the read signal R and the write signal W as inputs and provides four ground select output signals GS[3:0].

Figure 4:
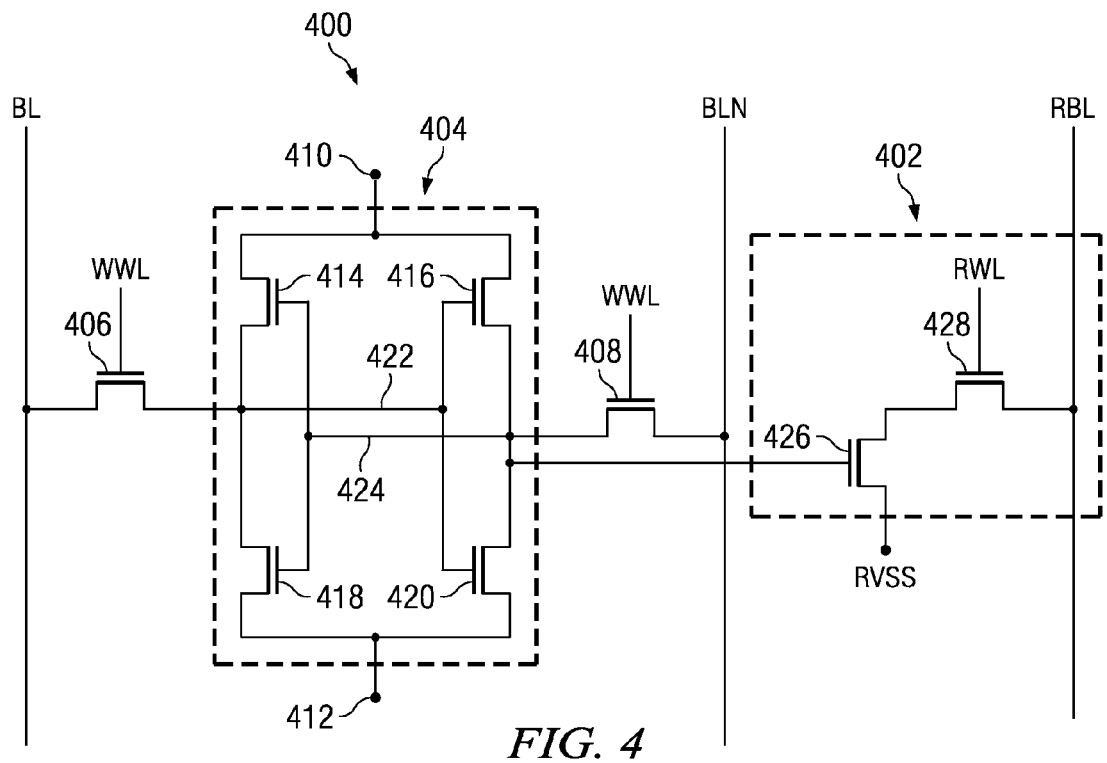
FIG. 4 is a schematic diagram of an eight-transistor SRAM cell. (Prior Art)

In this first embodiment, memory cells C00-C37 are eight-transistor SRAM cells as shown in FIG. 4. The eight-transistor SRAM cell shown in FIG. 4 includes a latch 404 connected between latch sourcing supply line 410 and latch sinking supply line 412, two NMOS (n-channel metal-oxide semiconductor) transistors 406 and 408 and a read buffer 402. The latch 404 includes two PMOS (p-channel metal-oxide semiconductor) transistors 414 and 416 and two NMOS transistors 418 and 420. The gates of transistors 414 and 418 are electrically connected to the drains of transistors 416, 420 and 408. The sources of the two PMOS transistors 414 and 416 are electrically connected to the latch sourcing supply line 410. The sources of the two NMOS transistors 414 and 416 are electrically connected to the latch sinking supply line 412. The gates of transistors 416 and 420 are electrically connected to the drains of transistors 406, 414 and 418. The write word line WWL is electrically connected to the gates of transistors 406 and 408. The source of transistor 406 is electrically connected to the write bitline BL and the source of transistor 408 is electrically connected to the write bitline BLN The read buffer 402 includes two NMOS transistors 426 and 428. The gate of transistor 426 is electrically connected to the drain of transistor 408 while the gate of transistor 428 is electrically connected to the read word line RWL. The source of transistor 428 is electrically connected to the read bit line RBL while the source of transistor 426 is connected to the read sinking voltage supply RVSS. The drains of transistors 426 and 428 are electrically connected. The write word line WWL, the read word line RWL and the read bit line RBL are not shown in FIG. 3.

Figure 5:
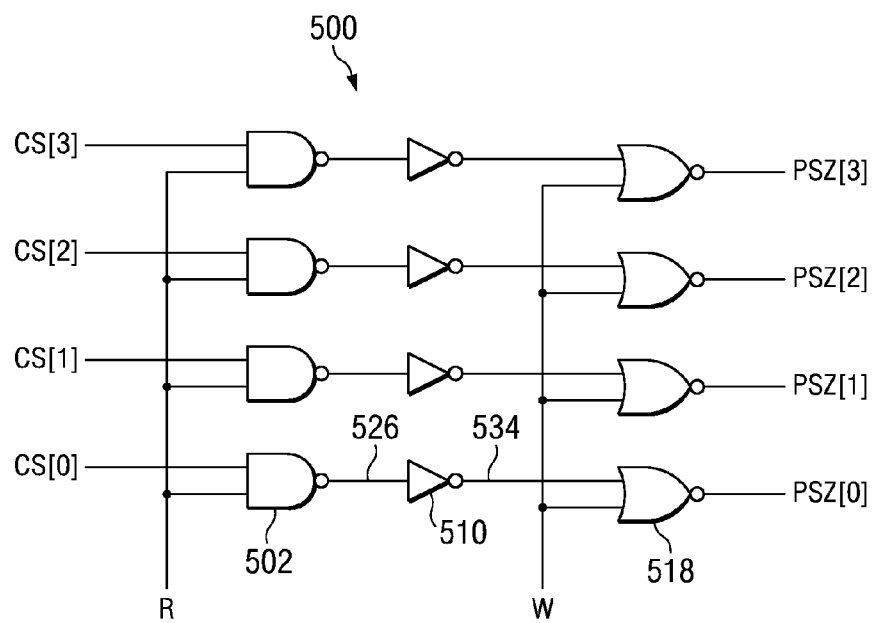
FIG. 5 is a schematic diagram a first power control circuit according to an embodiment of the invention.

In this first embodiment the voltage applied to addressed columns of memory cells during a read cycle of the array is higher than the voltage applied to unaddressed columns of memory cells during the read cycle of the array. The power control circuit 304 applies a signal to the control line PSZ[0] that causes power supply switches PSW 308 and PSW 316 to apply a nominal voltage VDDN that is higher than voltage VDDL that is applied by the other power switches PSW 310-314 and PSW 318-322. The power control circuit 304 makes this selection when column select signal CS[0] is activated and the read control signal R is active. FIG. 5 is an example of a circuit used as a power control circuit 304.

In this first embodiment of the invention, select signal CS[0] is activated when it has a logical high value and the read control signal R is activated when it is a logical high value. As shown in FIG. 5 when CS[0] is a logical high value and read control signal R is a logical high value, the output 526 of NAND gate 502 is a logical low value. The inverter 510 changes the logical low value to a logical high value on node 534. The write control signal W is a logical low value because data is being read in this example. Because the write control signal W is a logical low value and the output 534 of the inverter 510 is a logical high value, the output PSZ[0] of NOR 518 is a logical low value. The control signal PSZ[0] is an input to the power switches PSW 308 and PSW 316 that determine the voltage applied to latch sourcing supply lines 340 and 348.

Figure 6A:
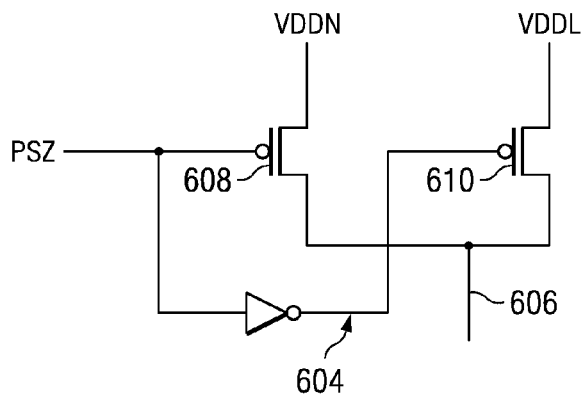
FIG. 6a is a schematic diagram of a first power switch. (Prior Art)

FIG. 6a shows an embodiment of a power switch PSW. In this first embodiment, when power select input PSZ to the power switch shown in FIG. 6a is low, VDDN is applied to node 606 and a logical high value is applied to node 604. Because node 604 is high logical value, VDDL is not applied to node 606. The output of power switch 308 is electrically connected to latch sourcing supply line 340. As a result, VDDN is applied to the latch sourcing supply line 340. The output of power switch 316 is electrically connected to latch sourcing supply line 348. As a result, VDDN is also applied to the latch sourcing supply line 348.

Because control signals PSZ[3-1] are inactivated (i.e. a logical high value), power switches 310-314 and 318-322 output a voltage VDDL. As a result, latch sourcing supply lines 342-346 and 350-354 are electrically connected to VDDL. Because the unaddressed columns operate at a lower voltage VDDL than the nominal voltage VDDN applied to the addressed columns, leakage power is saved. Because the unaddressed columns remain at the retention voltage VDDL instead of switching to the nominal voltage VDDN, active switching power is also saved.

Figure 7:
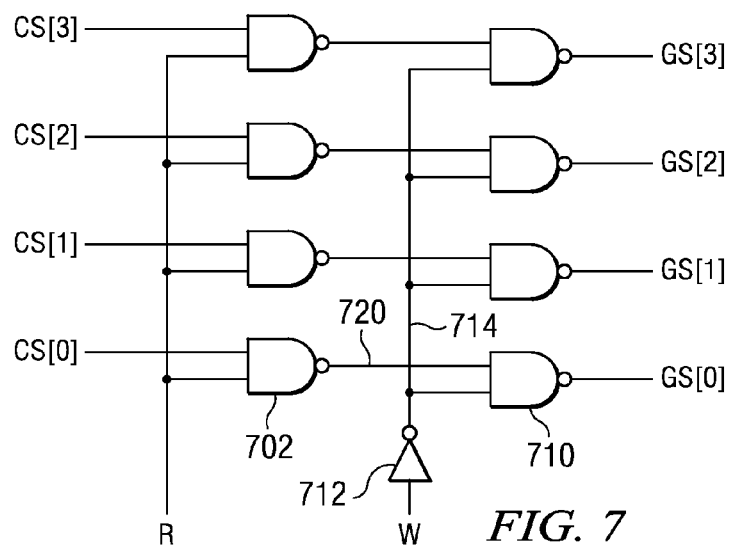
FIG. 7 is a schematic diagram a first ground control circuit according to an embodiment of the invention.

In this first embodiment the latch sourcing supply voltage applied to addressed columns during a read cycle of the array is higher than the latch sourcing supply voltage applied to unaddressed columns during the read cycle of the array. The ground control circuit 306 applies a signal to the control line GSZ[0] that causes ground switches GSW 324 and GSW 332 to apply a nominal voltage VSSN that is lower than voltage VSSH that is applied by the other ground switches GSW 326-330 and PSW 334-338. The ground control circuit 306 makes this selection when column select signal CS[0] is activated and the read control signal R is active. FIG. 7 is an example of a circuit used as a ground control circuit 304.

In this first embodiment, select signal CS[0] is activated (i.e. a logical high value) and the read control signal R is activated (i.e. a logical high value). As shown in FIG. 7 when CS[0] is a logical high value and read control signal R is a logical high value, the output 720 of NAND gate 702 is a logical low value. The write control signal W is a logical low value because data is being read in this first embodiment. Because the write control signal W is a logical low value, the output of the inverter 712 is a logical high value. Because the output 720 of NAND 702 is a logical low value, the output GS[0] of NAND 710 is a logical high value. The control signal GS[0] is an input to the power switches GSW 324 and GSW 332 that determine the voltage applied to latch sinking supply lines 356 and 364 respectively.

Figure 8A:
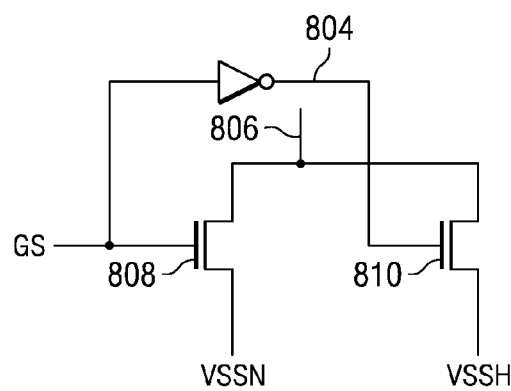
FIG. 8a is a schematic diagram of a first ground switch. (Prior Art)

FIG. 8a shows an embodiment of a ground switch GSW. In this first embodiment, when ground select input GS to the ground switch shown in FIG. 8a is high, VSSN is applied to node 806 and a logical low value is applied to node 804. Because node 804 is low logical value, VSSH is not applied to node 806. The output of ground switch 324 is electrically connected to latch sinking supply line 356. As a result, VSSN is applied to the latch sinking supply line 356. The output of ground switch 332 is electrically connected to latch sinking supply line 364. As a result, VSSN is applied to the latch sourcing supply line 364.

Because control signals GS[3-1] are inactivated (i.e. a logical low value), ground switches 326-330 and 334-338 output a voltage VSSH. As a result, ground switches 326-330 and 334-338 are electrically connected to VSSH. Because the unaddressed columns operate at a higher voltage VSSH than the nominal voltage VSSN applied to the addressed columns, power is saved.

In FIG. 3, both a power switch and a ground switch are used with the memory cell array. However, in another embodiment of the invention, only power switches are used with the memory cell array while the ground lines of the memory cell array are connected in a conventional manner such as those shown in FIG. 2. In another embodiment of the invention, only ground switches are used with the memory cell array while the power lines of the memory cell array are connected in a conventional manner such as those shown in FIG. 2.

Figure 9:
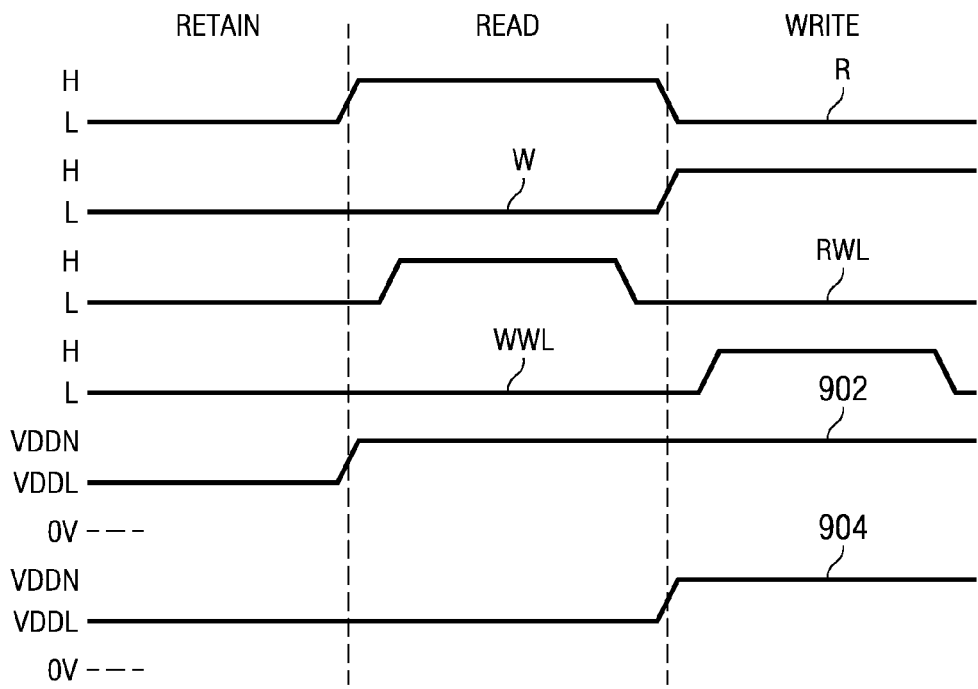
FIG. 9 is a timing diagram illustrating a retain cycle, a VDD-by-column read cycle and a normal write cycle of an SRAM with eight-transistor memory cells according to an embodiment of the invention.
Figure 10:
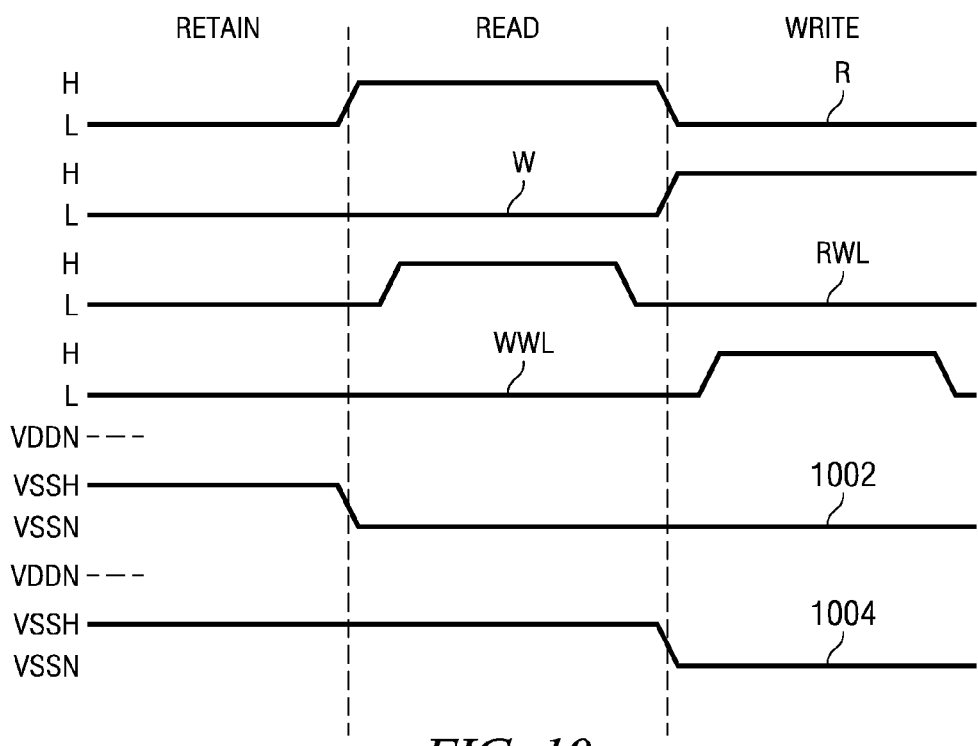
FIG. 10 is a timing diagram illustrating a retain cycle, a VSS-by-column read cycle and a normal write cycle of an SRAM with eight-transistor memory cells according to an embodiment of the invention.

FIG. 9 is a timing diagram of an eight-transistor SRAM cell array illustrating a retain cycle, a VDD-by-column read cycle and a nominal write cycle according to an embodiment of the invention. FIG. 10 is a timing diagram of an eight-transistor SRAM cell array illustrating a retain cycle, a VSS-by-column read cycle and a nominal write cycle according to an embodiment of the invention. During the retain cycle of the array in the first embodiment, the read control signal R is a logical low level, the write control signal W is a logical low level, the read word line RWL is logical low level and the write word line WWL is at a logical low level. As a result of the previous conditions, the voltage 902 applied to the latch sourcing supply lines 340 and 348 of the addressed columns and the voltage 904 applied to the latch sourcing lines 342-346 and 350-354 of the unaddressed columns are electrically connected to VDDL (see FIG. 9). The voltage 1002 applied to the latch sinking supply lines 356 and 364 of the addressed columns and the voltage 1004 applied to the latch sinking lines 358-362 and 366-370 of the unaddressed columns are electrically connected to VSSH (see FIG. 10). As a result, less power is used during the retain cycle because the voltage VDDL-VSSH is smaller than the nominal voltage VDDN-VSSN that would be applied to the memory cells C00-C37 during the retain cycle.

FIGS. 9 and 10 also illustrate the read cycle of the array previously explained in the first embodiment. During the read cycle of the array in the first embodiment, the read control signal is a logical high level, the write control signal W is a logical low level, the read word line RWL is logical high level and the write word line WWL is at a logical low level. As a result of the previous conditions, the voltage 902 applied to the latch sourcing supply lines 340 and 348 of the addressed columns is VDDN (see FIG. 9) and the voltage 1002 applied to the latch sinking supply lines 356 and 364 of the addressed columns is VSSN (see FIG. 10).

The voltage 904 applied to the latch sourcing supply lines 342-346 and 350-354 of the unaddressed columns is VDDL (see FIG. 9). The voltage 1004 applied to the latch sinking supply lines 358-362 and 366-370 of the unaddressed columns is VSSH (see FIG. 10). As a result, less power is used during the read cycle by the unaddressed columns because the voltage VDDL-VSSH applied to the unaddressed memory cells is lower than the power that would have been used by the unaddressed memory cells if the nominal voltage VDDN-VSSN would have been used by unaddressed memory cells. During the read cycle of the array, the low voltage VDDL-VSSH applied to the unaddressed memory cells does not cause disturb problems to the data stored in the latch of each of the memory cells because the write word lines are not activated to turn on the access transistors accessing the latches.

FIGS. 9 and 10 also illustrate a nominal write cycle of the array in the first embodiment. During the nominal write cycle of the array in the first embodiment, the read control signal is a logical low level, the write control signal W is a logical high value, the read word line RWL is logical low level and the write word line WWL is at a logical high level. As a result of the previous conditions, the voltage 902 applied to the latch sourcing supply lines 340 and 348 of the addressed columns is VDDN (see FIG. 9). The voltage 904 applied to the latch sourcing supply lines 342-346 and 350-354 of the unaddressed columns is VDDN (see FIG. 9). The voltage 1002 applied to the latch sinking supply lines 356 and 364 of the addressed columns and the voltage 1004 applied to the latch sinking lines 358-362 and 366-370 of the unaddressed columns is VSSN (see FIG. 10). As a result, no disturb problem in half-selected cells on a selected row would occur during the write cycle because nominal voltages VDDN and VSSN are used.

Figure 11:
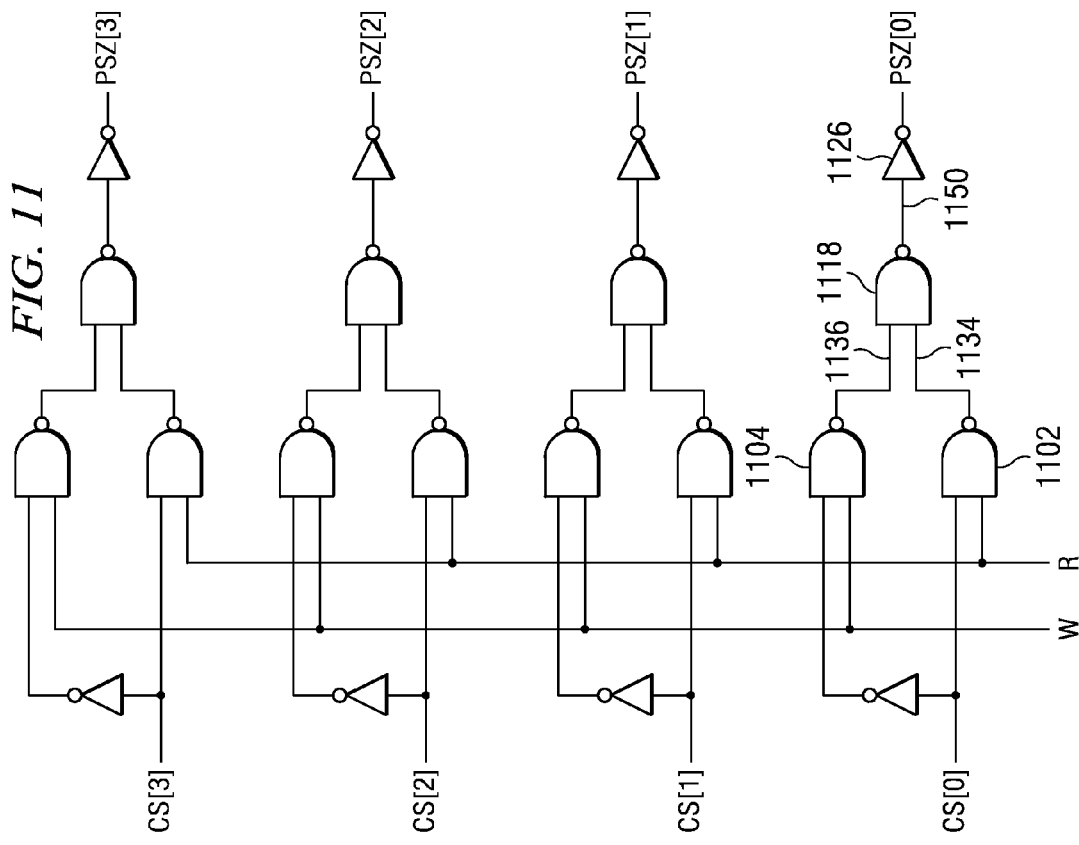
FIG. 11 is a schematic diagram of a second power control circuit according to an embodiment of the invention.

In a second embodiment of the invention as shown in FIGS. 3 and 4, power is saved in the retain cycle, the read cycle and the write cycle. During a read cycle, the power control circuit 304 applies a signal to the control line PSZ[0] that causes power supply switches PSW 308 and PSW 316 to apply a nominal voltage VDDN to the addressed columns that is higher than voltage VDDL that is applied by the other power switches PSW 310-314 and PSW 318-322 to the unaddressed columns. The power control circuit 304 makes this selection when column select signal CS [0] is activated and the read control signal R is active. FIG. 11 is an example of a circuit used as a power control circuit 304 according to an embodiment of the invention.

In this second embodiment during a read cycle, select signal CS[0] is activated (i.e. a logical high value), the read control signal R is activated (i.e. a logical high value) and the write control signal W is inactivated (i.e. a logical low value). As shown in FIG. 11 when CS[0] is a logical high value, read control signal R is a logical high value, and write control signal W is a logical low value, the output 1134 of NAND gate 1102 is a logical low value and the output 1136 of NAND gate 1104 is a logical high value. The output 1150 of NAND gate 1118 is a logical high value. The inverter 1126 changes the logical high value to a logical high value on node PSZ[0]. The control signal PSZ[0] is an input to the power switches PSW 308 and PSW 316 that determine the voltage applied to latch sourcing supply lines 340 and 348.

FIG. 6a shows an embodiment of a power switch PSW. In this first embodiment, when power select input PSZ to the power switch shown in FIG. 6a is low, VDDN is applied to node 606 and a logical high value is applied to node 604. Because node 604 is high logical value, VDDL is not applied to node 606. The output of power switch 308 is electrically connected to latch sourcing supply line 340. As a result, VDDN is applied to the latch sourcing supply line 340. The output of power switch 316 is electrically connected to latch sourcing supply line 348. As a result, VDDN is applied to the latch sourcing supply line 348.

Because control signals PSZ[3-1] are inactivated (i.e. a logical high value), power switches 310-314 and 318-322 output a voltage VDDL. As a result, latch sourcing supply lines 342-346 and 350-354 are electrically connected to VDDL. Because the unaddressed columns operate at a lower voltage VDDL than the nominal voltage VDDN applied to the addressed columns, power is saved.

Figure 12:
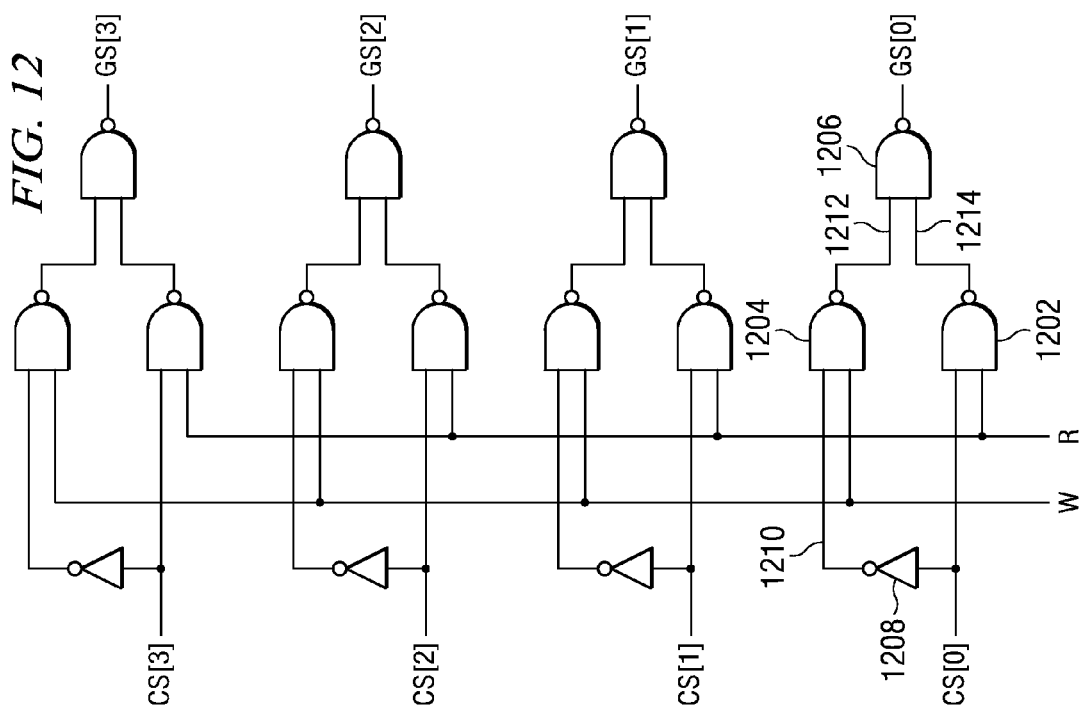
FIG. 12 is a schematic diagram of a second ground control circuit according to an embodiment of the invention.

In this second embodiment the voltage applied to addressed columns during a read is higher than the unaddressed columns. During the read cycle, the ground control circuit 306 applies a signal to the control line GS[0] that causes ground switches GSW 324 and GSW 332 to apply a nominal voltage VSSN that is lower than voltage VSSH that is applied by the other ground switches GSW 326-330 and PSW 334-338. The ground control circuit 306 makes this selection when column select signal CS[0] is activated and the read control signal R is active. FIG. 12 is an example of a circuit used as a ground control circuit 306.

In this second embodiment, select signal CS[0] is activated when it is a logical high value, the read control signal R is activated when it is a logical high value and the write control signal W is activated when it is a local high value. As shown in FIG. 12 when CS[0] is a logical high value, read control signal R is a logical high value and write control signal W is a logical low value, the output 1214 of NAND gate 1202 is a logical low value and the output 1212 of NAND gate 1204 is a logical high value. The output GS[0] of NAND 1206 is a logical high value. The control signal GS [0] is an input to the power switches GSW 324 and GSW 332 that determine the voltage applied to latch sinking lines 356 and 364.

FIG. 8a shows an embodiment of a ground switch GSW. In this second embodiment, when ground select input GS to the power switch shown in FIG. 8a is a logical high value, VSSN is applied to node 806 and a logical low value is applied to node 804. Because node 804 is low logical value, VSSH is not applied to node 806. The output of ground switch 324 is electrically connected to latch sinking supply line 356. As a result, VSSN is applied to the latch sinking supply line 356. The output of ground switch 332 is electrically connected to latch sinking supply line 364. As a result, VSSN is applied to the latch sourcing supply line 364.

Because control signals GS[3-1] are inactivated (i.e. a logical low value), ground switches 326-330 and 334-338 output a voltage VSSH. As a result, ground switches 326-330 and 334-338 are electrically connected to VSSH. Because the unaddressed columns operate at a higher voltage VSSH than the nominal voltage VSSN applied to the addressed columns, power is saved.

Figure 13:
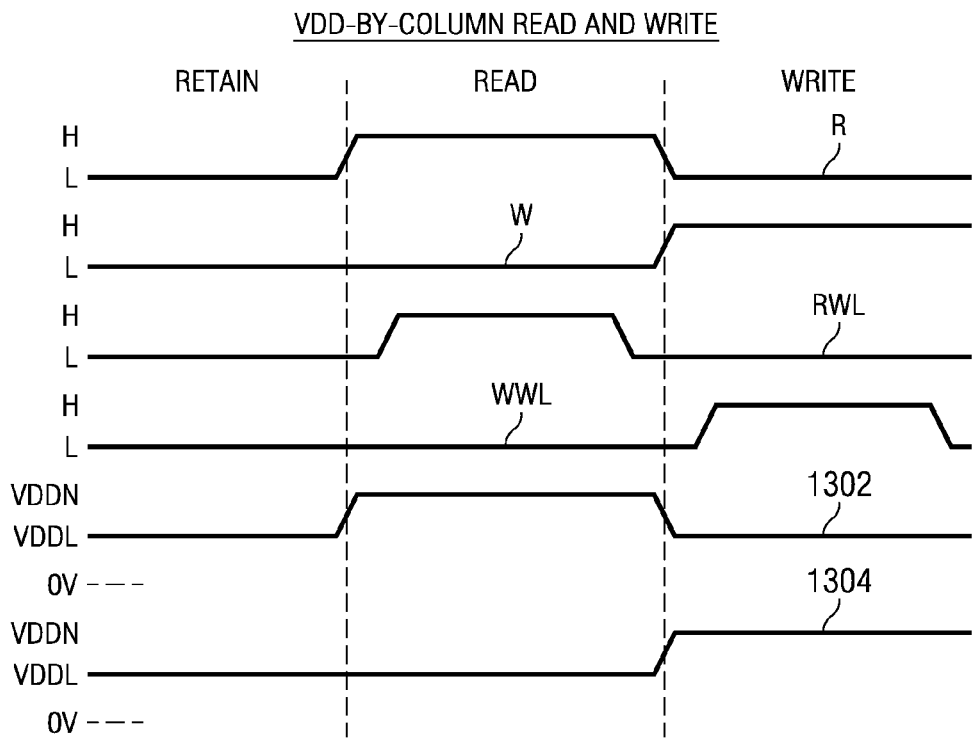
FIG. 13 is a timing diagram illustrating a retain cycle, a VDD-by-column read cycle and a VDD-by-column write cycle of an SRAM with eight-transistor memory cells according to an embodiment of the invention.
Figure 14:
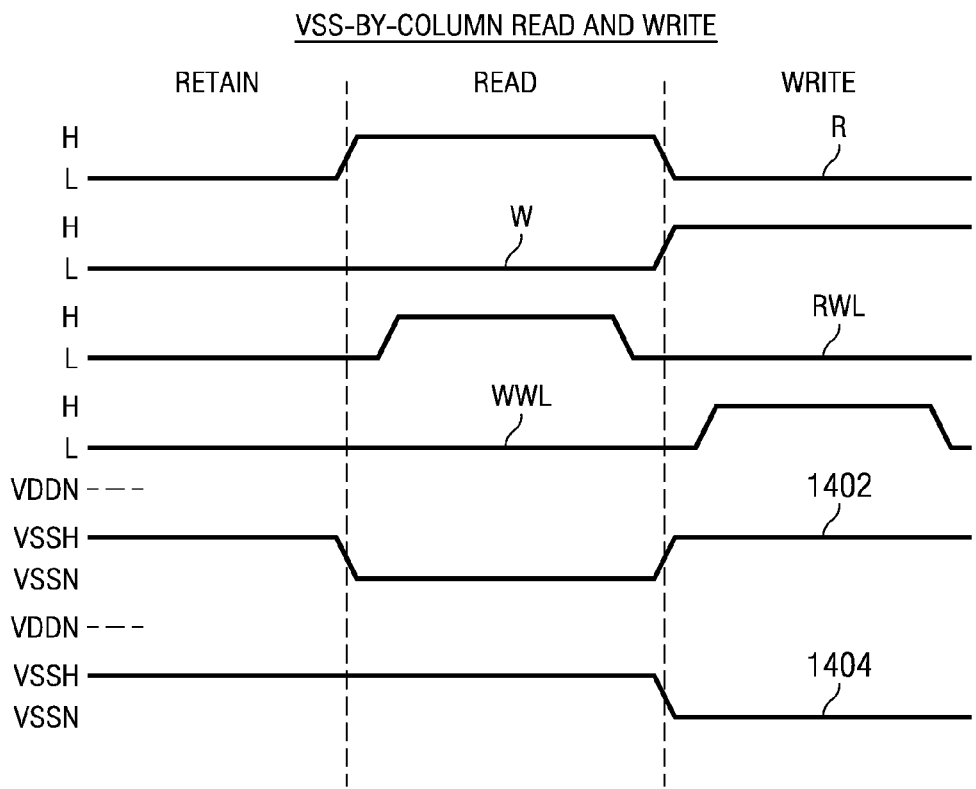
FIG. 14 is a timing diagram illustrating a retain cycle, a VSS-by-column read cycle and a VSS-by-column write cycle of an SRAM with eight-transistor memory cells according to an embodiment of the invention.

FIG. 13 is a timing diagram of the second embodiment of an eight transistor SRAM cell array with a retain cycle, a VDD-by-column read cycle and a VDD-by-column write cycle according to an embodiment of the invention. FIG. 14 is a timing diagram of an embodiment of an eight-transistor SRAM cell array with a retain cycle, a VSS-by-column read cycle and a VSS-by-column write cycle according to an embodiment of the invention. During the retain cycle of the array in the second embodiment, the read control signal R is a logical low level, the write control signal W is a logical low level, the read word line RWL is logical low level and the write word line WWL is at a logical low level. As a result of the previous conditions, the voltage 1302 applied to the latch sourcing supply lines 340 and 348 of the addressed columns and the voltage 1304 applied to the latch sourcing lines 342-346 and 350-354 of the unaddressed columns are electrically connected to VDDL (see FIG. 13). The voltage 1402 applied to the latch sinking supply lines 356 and 364 of the addressed columns and the voltage 1404 applied to the latch sinking lines 358-362 and 366-370 of the unaddressed columns are electrically connected to VSSH (see FIG. 14). As a result, less power is used during the retain cycle because the voltage VDDL-VSSH is smaller than the nominal voltage VDDN-VSSN that would be applied to the memory cells C00-C37 during the retain cycle.

FIGS. 13 and 14 also illustrate the read cycle of the array previously explained in the second embodiment. During the read cycle of the array in the second embodiment, the read control signal R is a logical high level, the write control signal W is a logical low level, the read word line RWL is logical high level and the write word line WWL is at a logical low level. As a result of the previous conditions, the voltage 1302 applied to the latch sourcing supply lines 340 and 348 of the addressed columns is VDDN (see FIG. 13) and the voltage 1402 applied to the latch sinking supply lines 356 and 364 of the addressed columns is VSSN (see FIG. 14).

The voltage 1304 applied to the latch sourcing supply lines 342-346 and 350-354 of the unaddressed columns is VDDL (see FIG. 13). The voltage 1404 applied to the latch sinking supply lines 358-362 and 366-370 of the unaddressed columns is VSSH (see FIG. 14). As a result, less power is used during the read cycle by the unaddressed columns because the voltage VDDL-VSSH applied to the unaddressed memory cells is lower than the power that would have been used by the unaddressed memory cells if the normal voltage VDDN-VSSN would have been used by unaddressed memory cells.

FIGS. 13 and 14 also illustrate a VDD-by-Column and a VSS-by-Column write cycle of the second embodiment. During the VDD-by-Column and the VSS-by-Column write cycle of the second embodiment, the read control signal R is a logical low level, the write control signal W is a logical high value, the read word line RWL is logical low level and the write word line is at a logical high level. As a result, the voltage 1302 applied to the latch sourcing supply lines 340 and 348 of the addressed columns is VDDL (see FIG. 13). The voltage 1402 of the latch sinking supply lines 356 and 364 of the addressed columns is VSSH (see FIG. 14). The voltage 1304 applied to the latch sourcing lines 342-346 and 350-354 of the unaddressed columns is VDDN (see FIG. 13). The voltage 1404 applied to the latch sinking supply lines 358-362 and 366-370 of the unaddressed columns is VSSH (see FIG. 14). As a result, less leakage power is used during the write cycle by the addressed columns because the voltage VDDL-VSSH applied to the column addressed memory cells is lower than the normal voltage VDDN-VSSN that would have been used by the column addressed memory cells.

Also, less active power is used during the write cycle by the column addressed memory cells because the voltage applied to the column addressed memory cells is not switched from the retention voltage VDDL-VSSH. In addition, write yield is improved because the voltage VDDL-VSSH applied to the column addressed memory cells is lower than the normal voltage VDDN-VSSN that would have been used.

Figure 15:
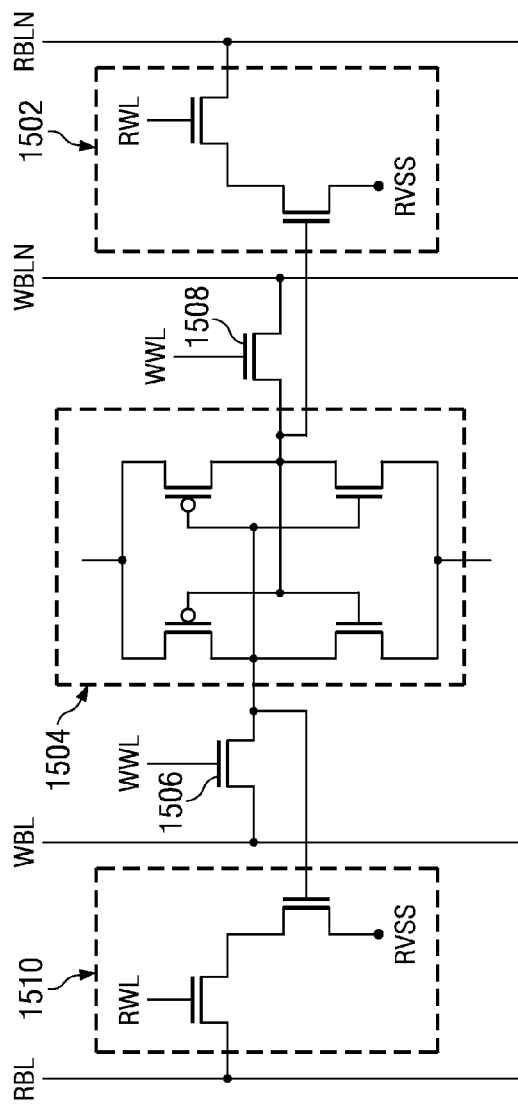
FIG. 15 is a schematic diagram of a ten-transistor memory cell. (Prior Art)

In the previous first and second embodiments of the invention, an eight-transistor SRAM cell (See FIG. 4) was used as a memory cell for cells C00-C37 to illustrate principles of the invention. It should be noted that a ten-transistor SRAM cell as shown in FIG. 15 may also be used as memory cell for cells C00-C37 in the previously described first and second embodiments. The ten-transistor SRAM cell shown in FIG. 15 includes a latch 1504, a first read buffer 1502, a second read buffer 1510, transfers transistors 1506 and 1508. The write word line WWL, the read word line RWL and the read bit lines RBL and RBLN are not shown in FIG. 3.

Figure 6B:
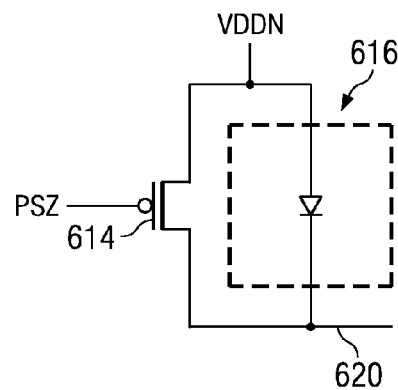
FIG. 6b is a schematic diagram of a second power switch. (Prior Art)

In the previous first and second embodiment of the invention, an embodiment of a power switch PSW was shown in FIG. 6a. In this example, two fixed voltage supplies VDDN and VDDL could be selected to be applied to the latch sourcing supply lines 342-354. In another embodiment of a power switch PSW a diode may be used in conjunction with a single fixed voltage supply VDDN as shown in FIG. 6b. In FIG. 6b, a diode 616 is connected in parallel with a PMOSFET 614.

The power select input PSZ is driven to a low logical value when it is desired to have the single fixed voltage VDDN applied to node 620. When the input node PSZ is driven to a logical high value, current is conducted through the diode 616. As a result, the voltage on node 620 is equal to VDDN-Vt where Vt is equal to the threshold voltage of the diode. Because there is a threshold voltage drop, the voltage on node 620 is lower than VDDN.

Figure 6C:
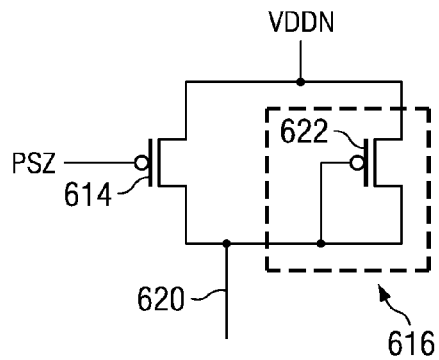
FIG. 6c is a schematic diagram of a third power switch. (Prior Art)
Figure 6D:
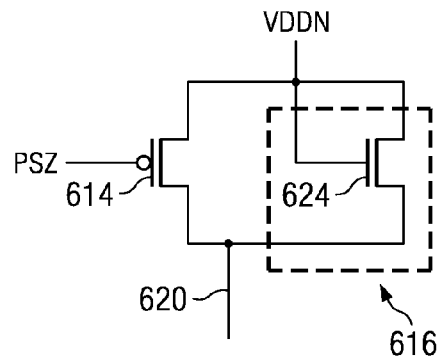
FIG. 6d is a schematic diagram of a fourth power switch. (Prior Art)

FIG. 6c illustrates how a diode 616 may be created using a PMOSFET 622 where the gate of the PMOSFET 622 is connected to the drain of the PMOSFET at node 620 and the source is connected to VDDN. FIG. 6d illustrates how a diode 616 may be created using an NMOSFET 624 where the gate and the drain of the NMOSFET 624 are connected to VDDN and the source is connected to node 620.

Figure 8B:
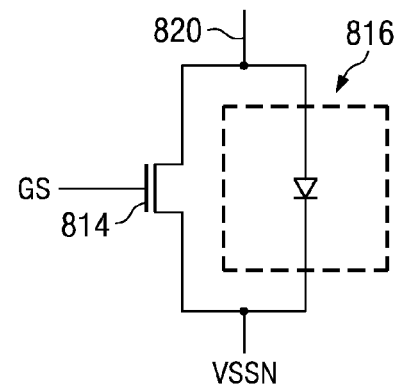
FIG. 8b is a schematic diagram of a second ground switch. (Prior Art)

In the previous first and second embodiments of the invention, an embodiment of a ground switch GSW was shown in FIG. 8a. In this example, two fixed voltage supplies VSSN and VSSH may be selected to be applied to the latch sinking supply lines 356-370. In another embodiment of a ground switch GSW, a diode may be used in conjunction with a single fixed voltage supply VSSN as shown in FIG. 8b. In FIG. 8b, a diode 816 is connected in parallel with an NMOSFET 814. The ground select input GS is driven to a high logical value when it is desired to have the single fixed voltage VSSN applied to node 820. When the input node GS is driven to a logical low value, current is conducted through the diode 816. As a result, the voltage on node 620 is equal to VSSN+Vt where Vt is equal to the threshold voltage of the diode. Because there is a threshold voltage drop, the voltage on node 620 is higher than VDDN.

Figure 8C:
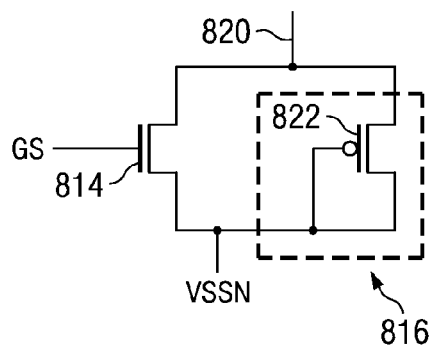
FIG. 8c is a schematic diagram of a third ground switch. (Prior Art)
Figure 8D:
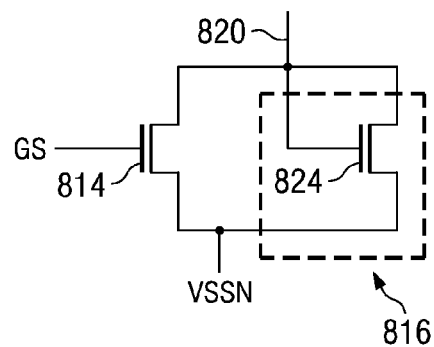
FIG. 8d is a schematic diagram of a fourth ground switch. (Prior Art)

FIG. 8c illustrates how a diode 816 may be created using a PMOSFET 822 where the gate and drain of the PMOSFET 822 is connected to VSSN and the source of the PMOSFET 822 is connected to node 820. FIG. 8d illustrates how a diode 816 may be created using an NMOSFET 824 where the gate and the drain of the NMOSFET 824 are connected to node 820 and the source of the NMOSFET 824 is connected to VSSN.

In the above description, both by-column power voltage control and by-column ground voltage control are used with the operation of the memory cell array. However, in another embodiment of the invention, only by-column power voltage control is used with the operation of the memory cell array while the ground voltage of the memory cell array is not by-column controlled as shown in FIG. 2. In another embodiment of the invention, only by-column ground voltage control is used with the operation of the memory cell array while the power voltage of the memory cell array is not by-column controlled as shown in FIG. 2.

Figure 16:
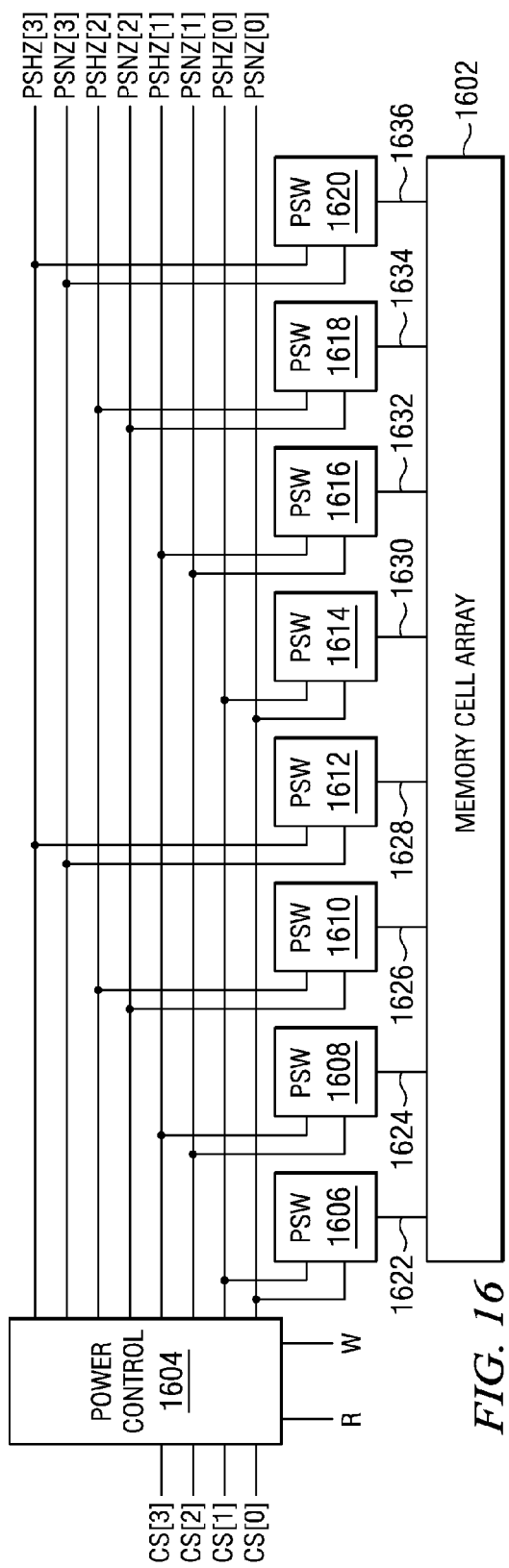
FIG. 16 is a block diagram of an SRAM interleaved memory array with voltage supply control according to an embodiment of the invention.

FIG. 16 is a block diagram of an interleaved SRAM cell array 1602 with power control 1604 according to an embodiment of the invention. In this third embodiment, the voltages applied to latch sourcing supply lines 1622-1636 of the memory array may be varied individually based on whether a column is addressed and whether a column is being read or written. The voltages applied to the latch sourcing supply lines 1622-1636 are provided by the power switches PSW 1606-1620.

Figure 17:
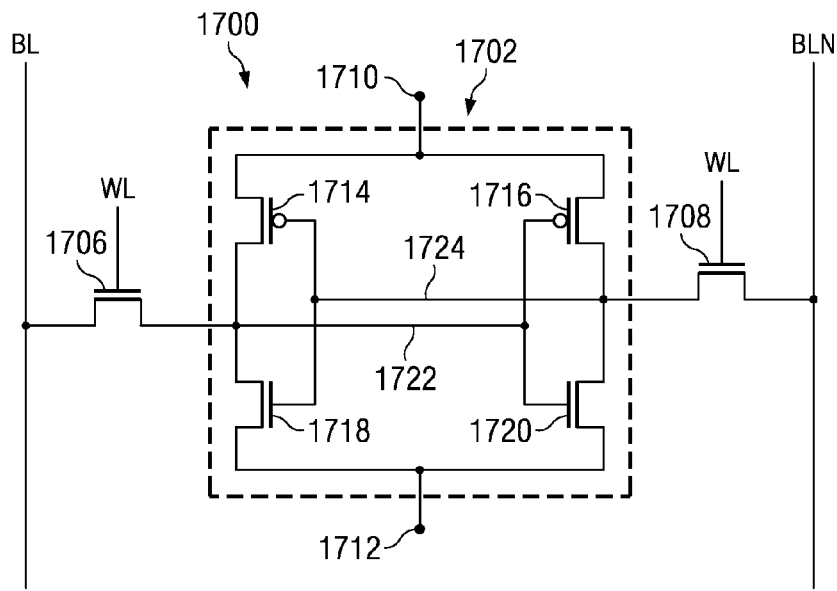
FIG. 17 is a schematic diagram of a six-transistor SRAM cell. (Prior Art)

In this third embodiment, the control for the power switches PSW 1606-1620 is provided by a power control circuit 1604. The power control circuit 1604 uses the column select signals CS[3:0], the read signal R and the write signal W as inputs and provides eight power select output signals PSHZ[3:0] and PSNZ[3:0]. The memory cells (not shown) in this third embodiment are six-transistor SRAM cells as shown in FIG. 17. The six-transistor SRAM cell shown in FIG. 17 includes a latch 1702 and two transfer transistors 1706 and 1708.

The latch 1702 is connected between the latch sourcing supply line 1710 and the latch sinking supply line 1712. The latch 1702 includes two PMOS (p-type channel metal-oxide semiconductor) transistors 1714 and 1716 and two NMOS (n-type channel metal-oxide semiconductor) transistors 1718 and 1720. The gates of transistors 1714 and 1718 are electrically connected to the drains of transistors 1716, 1720 and 1708. The sources of the two PMOS transistors 1714 and 1716 are electrically connected to the latch sourcing supply line 1710. The sources of the two NMOS transistors 1714 and 1716 are electrically connected to the latch sinking supply line 1712. The gates of transistors 1716 and 1720 are electrically connected to the drains of transistors 1706, 1714 and 1718. The word line WL is connected to the gates of the two transfer transistors 1706 and 1708. The source of transfer transistor 1706 is connected to bit line BL and the source of transfer transistor 1708 is connected to bit line BLN.

Figure 18:
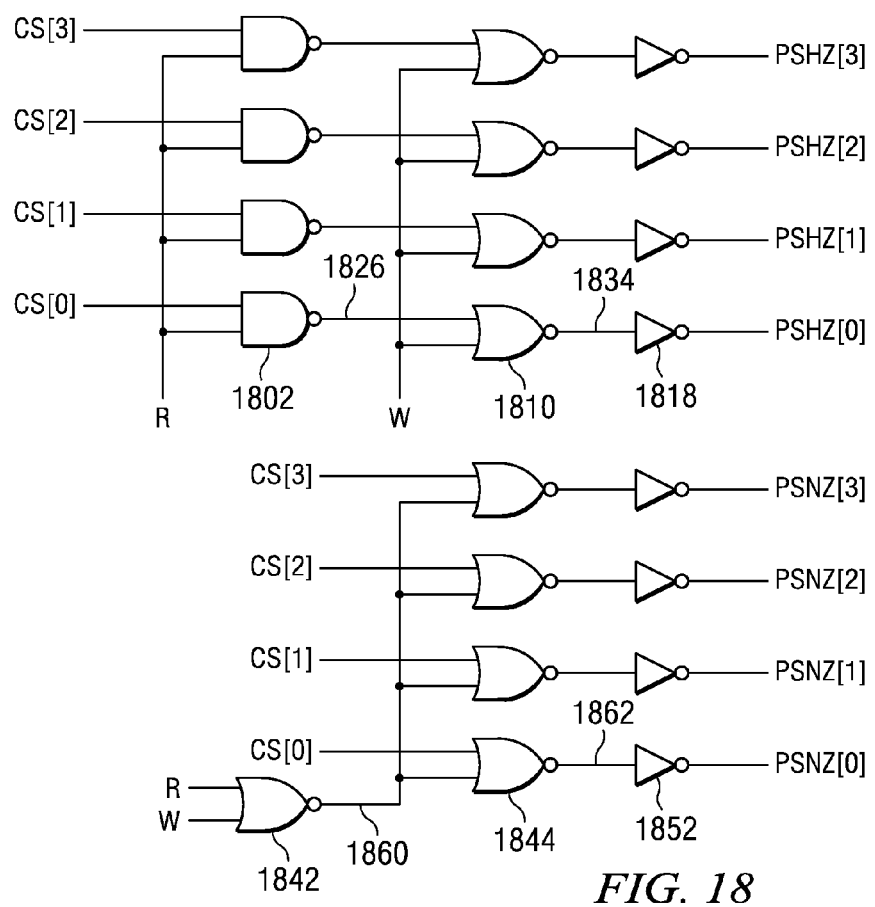
FIG. 18 is a schematic of a power control circuit according to an embodiment of the invention.

In this third embodiment, the voltage applied to addressed columns of memory cells during a read cycle of the array is higher than the voltage applied to the unaddressed columns during a read of the array. The power control circuit 1604 applies signals to control lines PSNZ [0] and PSHZ [0] that causes power supply switches PSW 1606 and PSW 1614 to apply a voltage VDDH that is higher than voltage VDDN that is applied by the other power switches PSW 1608-1612 and PSW 1616-1620. The power control circuit 1604 makes this selection when column select signal CS [0] is activated and the read control signal R is active. FIG. 18 is an example of part of a circuit used as a power control circuit 1604 according to an embodiment of the invention.

In this third embodiment, select signal CS [0] is activated when it is a logical high value and the read control signal R is activated it is a logical high value. As shown in FIG. 18 when CS [0] is a logical high value and read control signal R is a logical high value, the output 1826 of NAND gate 1802 is a logical low value. Because write control signal W is a logical low value, the output 1834 of NOR gate 1810 is a high logical value. Inverter 1818 changes the output 1834 to a low logical value at PSHZ [0]. As shown in FIG. 18 when write control signal W is a logical low value and read control signal R is a logical high value, the output 1860 of NOR gate 1842 is a logical low value. Because signal CS [0] is a logical high value, the output 1862 of NOR gate 1844 is a logical low value. Inverter 1852 changes the output 1862 to a logical high value at PSNZ [0].

Figure 19A:
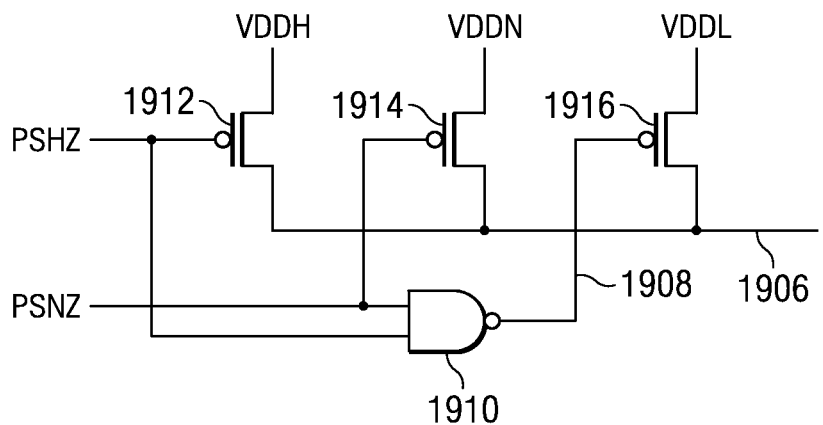
FIG. 19a is a schematic diagram of a fifth power switch according to an embodiment of the invention.

FIG. 19a shows an embodiment of a power switch PSW according to an embodiment of the invention. In this embodiment, when power select input PSHZ to the power switch shown in FIG. 19a is a logical low level and power select input PSNZ is a logical high value, VDDH is applied to node 1906 and a logical high value is applied to nodes PSNZ and 1908. Because nodes PSNZ and 1908 are high logical values, VDDN and VDDL are not applied to node 1906. The output of power switch 1606 is electrically connected to latch sourcing supply line 1622. As a result, VDDH is applied to the latch sourcing supply line 1622. The output of power switch 1614 is electrically connected to latch sourcing supply line 1630. As a result, VDDH is applied to the latch sourcing supply line 1630.

Because power select control signals PSZH[3-1] are inactivated (i.e. a logical high value) and power select control signals PSNZ[3-1] are activated (i.e. a logical low value), power switches 1608-1612 and 1616-1602 output a voltage VDDN. As a result, latch sourcing supply lines 1624-1628 and 1632-1636 are electrically connected to VDDN. Because the unaddressed columns operate at a lower voltage VDDN than the higher voltage VDDH applied to the addressed columns, power is saved.

Figure 20:
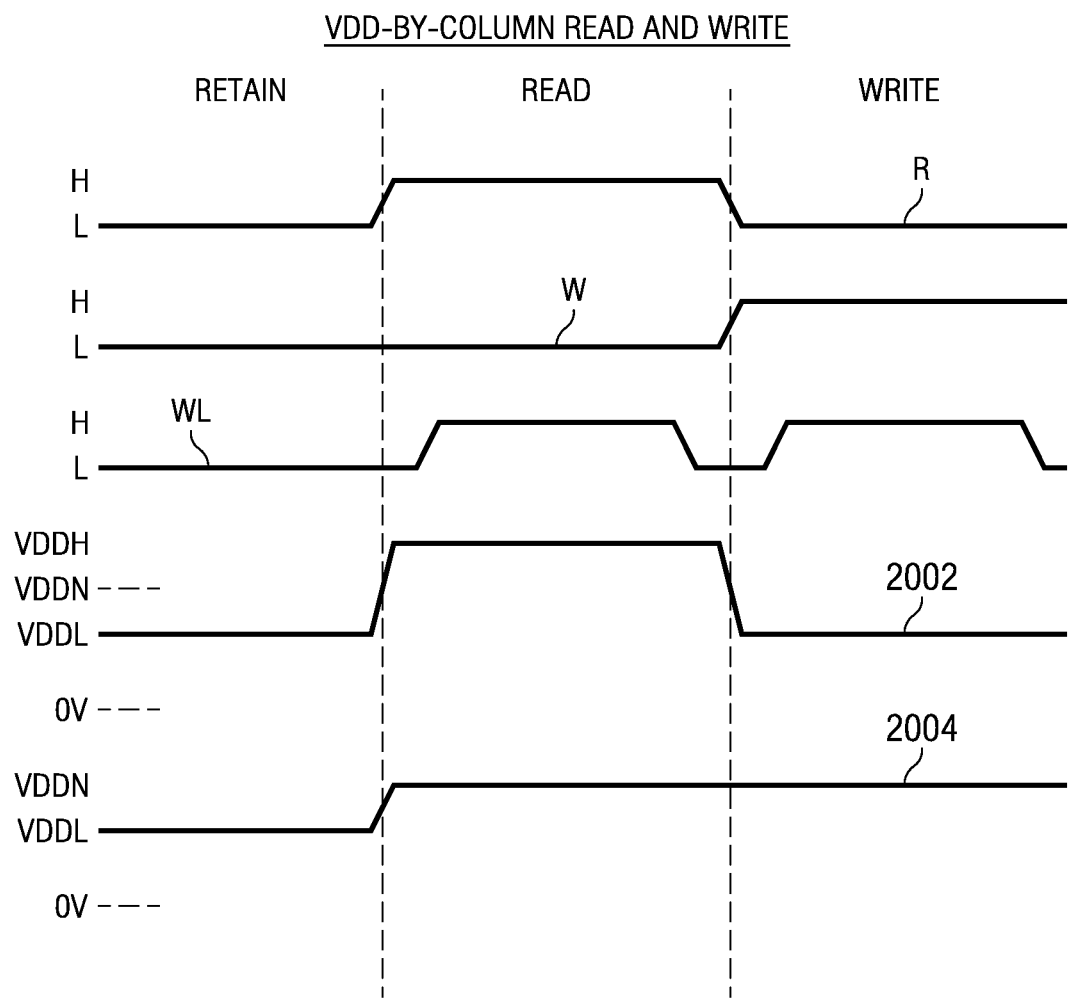
FIG. 20 is a timing diagram illustrating a retain cycle, a VDD-by-column read cycle and a VDD-by-column write cycle of an embodiment of an SRAM with six-transistor memory cells.

FIG. 20 is a timing diagram illustrating a retain cycle, a VDD-by-column read cycle and a VDD-by-column write cycle of an SRAM cell array that uses six-transistor SRAM cells according to an embodiment of the invention. During the retain cycle of the array in the third embodiment, the read control signal R is a logical low level, the write control signal W is a logical low level and the word line WL is at a logical low level. As a result of the previous conditions, the voltage 2002 applied to the latch sourcing supply lines 1622 and 1630 of the addressed columns and the voltage 2004 applied to the latch sourcing lines 1624-1628 and 1632-1636 of the unaddressed columns are electrically connected to VDDL (see FIG. 20). As a result, less power is used during the retain cycle because the voltage VDDL is smaller than the nominal voltage VDDN that would have been applied to the memory cells during the retain cycle.

FIG. 20 also illustrates the VDD-By-Column read cycle previously explained in the third embodiment. During the read cycle of the array in the third embodiment, the read control signal R is a logical high level, the write control signal W is a logical low level and the word line WL is at a logical high level. As a result of the previous conditions, the voltage 2002 applied to the latch sourcing supply lines 1622 and 1630 of the addressed columns is VDDH (see FIG. 20). The voltage 2004 applied to the latch sourcing supply lines 1624-1628 and 1632-1636 of the unaddressed columns is the nominal voltage VDDN (see FIG. 20). As a result, less power is used during the read cycle by the unaddressed columns because the voltage VDDN applied to the unaddressed memory cells is lower than the power that would have been used by the unaddressed memory cells if the high voltage VDDH would have been used by unaddressed memory cells.

FIG. 20 also illustrate a VDD-by-Column write cycle of the third embodiment. During the VDD-by-Column write cycle of the array in the third embodiment, the read control signal R is a logical low level, the write control signal W is a logical high value and the word line WL is at a logical high level. As a result, the voltage 2002 applied to the latch sourcing supply lines 1622 and 1628 of the addressed columns is VDDL (see FIG. 20). The voltage 2004 applied to the latch sourcing lines 1624-1628 and 1632-1636 of the unaddressed columns is VDDN (see FIG. 20). As a result, less power is used during the write cycle by the addressed columns because the voltage VDDL applied to the addressed memory cells is lower than the normal voltage VDDN that would have been used. Also, writing becomes easier because the voltage VDDL applied to the addressed memory cells is lower than the normal voltage VDDN that would have been used.

Figure 19B:
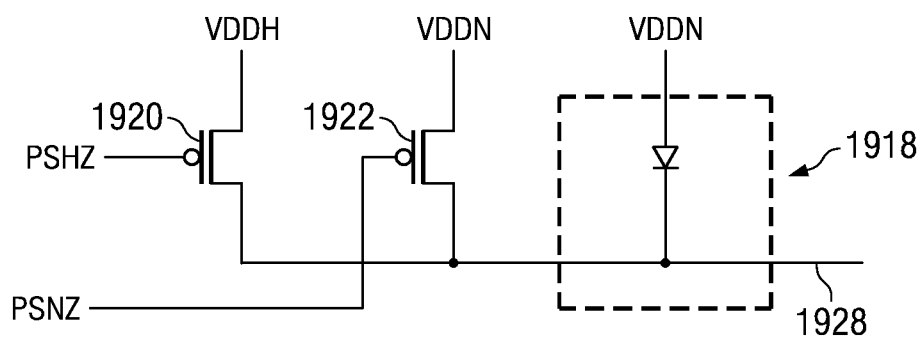
FIG. 19b is a schematic diagram of a sixth power switch according to an embodiment of the invention.

In the previous third embodiment of the invention, an embodiment of a power switch PSW was shown in FIG. 19a. In this example, three fixed voltage supplies VDDH, VDDN and VDDL could be selected to be applied to the latch sourcing supply lines 1622-1636. In another embodiment of a power switch PSW a diode may be used in conjunction with two fixed voltage supplies VDDH and VDDN as shown in FIG. 19b. In FIG. 19b, according to an embodiment of the invention, a diode 1918 is connected in parallel with two PMOSFETs 1920 and 1922. When power select input PSHZ is a logical low level and power select input PSNZ is a logical high value, VDDH is applied at node 1928. In this case, the diode 1918 is reversed biased because the cathode, node 1928, of the diode 1918 is at higher voltage than the anode, VDDN, of the diode 1918. When input PSHZ is a logical high level and input PSNZ is a logical low value, VDDN is applied at node 1928. When input PSHZ is a logical high value and input PSNZ is a logical high value, current is conducted through the diode 1918. As a result, the voltage on node 1928 is equal to VDDN-Vt where Vt is equal to the threshold voltage of the diode 1918. Because there is a threshold voltage drop, the voltage VDDL on node 1928 is lower than VDDN.

Figure 19C:
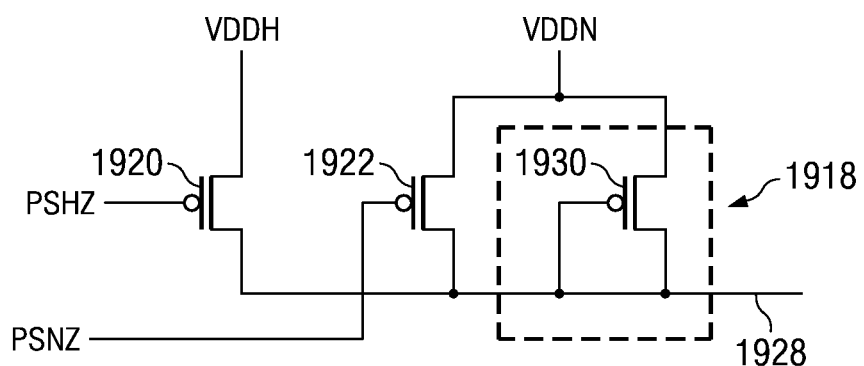
FIG. 19c is a schematic diagram of a seventh power switch according to an embodiment of the invention.
Figure 19D:
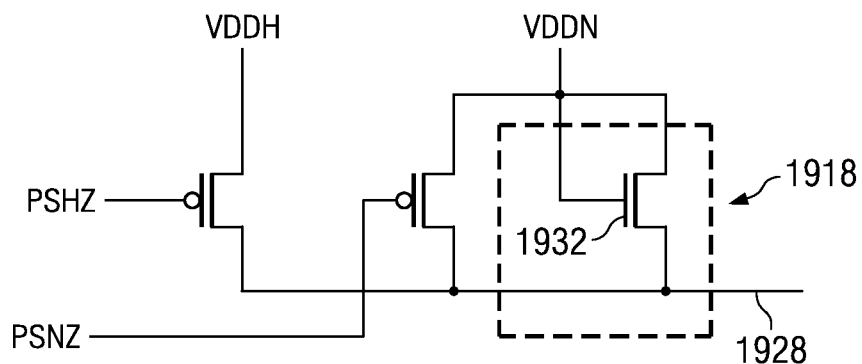
FIG. 19d is a schematic diagram of an eighth power switch according to an embodiment of the invention.

FIG. 19c, according to an embodiment of the invention, illustrates how a diode 1918 may be created using a PMOSFET 1930 where the gate of the PMOSFET 1930 is connected to the drain of the PMOSFET 1930 at node 1928 and the source is connected to VDDN. FIG. 19d, according to an embodiment of the invention, illustrates how a diode 1918 may created using an NMOSFET 1932 where the gate and the drain of the NMOSFET 1932 are connected to VDDN and the source is connected to node 1928.

Although power supply circuits are described in FIGS. 16-20, it is anticipated that ground supply circuits may be constructed according to the principles taught in the description of FIGS. 16-20. It is also anticipated that both power supply circuits shown in FIGS. 16-20 and ground supply circuits constructed according to the principles taught in the description of FIGS. 16-20 may be used with a memory cell array.

The foregoing description has been presented for purposes of illustration and description. It is not intended to be exhaustive or to limit the invention to the precise form disclosed, and other modifications and variations may be possible in light of the above teachings. The embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. A method of reducing power used in a static random access memory (SRAM), comprising:
   providing an array of memory cells in the SRAM, the array of memory cells arranged in rows and columns, each row of the memory cells connected to a word line, and each column of the memory cells connected to a bit line, a latch sourcing supply line, and a latch sinking supply line;
   applying a first voltage between latch sourcing and latch sinking supply lines for a column of memory cells that are in the array and are column addressed during a read cycle of the array; and
   applying a second voltage between latch sourcing and latch sinking supply lines for a column of memory cells that are in the array and are not column addressed during the read cycle of the array;
   wherein the first voltage is greater than the second voltage; and
   wherein each memory cell in the array comprises:
   a latch connected between a latch sourcing supply line and a latch sinking supply line; and
   at least one read buffer.

2. The method of claim 1 further comprising:
   applying a third voltage between latch sourcing and latch sinking supply lines for a column of memory cells that are in the array and are column addressed during a write cycle of the array;

applying a fourth voltage between latch sourcing and latch sinking supply lines for a column of memory cells that are in the array and are not column addressed during the write cycle of the array;
wherein the fourth voltage is greater than the third voltage.

3. A static random access memory (SRAM) in an integrated circuit, comprising:
an array of memory cells arranged in rows and columns, each row of the memory cells connected to a word line, and each column of the memory cells connected to a bit line, a latch sourcing supply line and a latch sinking supply line; and
a plurality of supply switches, each connected to a latch sourcing or a latch sinking supply line for one of the columns;
wherein each memory cell in the array comprises:
a latch connected between a latch sourcing supply line and a latch sinking supply line; and
at least one read buffer;
wherein each column of the memory cells is connected to one of the plurality of supply switches;
wherein a first voltage is applied between latch sourcing and latch sinking supply lines for a column of memory cells that are in the array and are column addressed during a read cycle of the array;
wherein a second voltage is applied between latch sourcing and latch sinking supply lines for a column of memory cells that are in the array and are not column addressed during the read cycle of the array; and
wherein the first voltage is greater than the second voltage.

4. The static random access memory (SRAM) of claim 3, wherein the first voltage is equal to a nominal voltage and the second voltage is equal to a low voltage.

5. The static access memory (SRAM) of claim 4 where the low voltage is selected from a group of voltages consisting of a low power mode voltage and a data retention mode voltage.

6. The static random access memory (SRAM) of claim 3, wherein a third voltage applied to the latch sourcing supply line for the column of memory cells that are in the array and are column addressed during the read cycle of the array is higher than a fourth voltage applied to the latch sourcing supply line for the column of memory cells that are in the array and are not column addressed during the read cycle of the array.

7. The static random access memory (SRAM) of claim 3, wherein a fifth voltage applied to the latch sinking supply line for the column of memory cells that are in the array and are column addressed during the read cycle of the array is lower than a sixth voltage applied to the latch sinking supply line for the column of memory cells that are in the array and are not column addressed during the read cycle of the array.

8. The static random access memory (SRAM) of claim 3 wherein a seventh voltage is applied between latch sourcing and latch sinking supply lines for a column of memory cells that are in the array and are column addressed during a write cycle of the array;
wherein an eighth voltage is applied between latch sourcing and latch sinking supply lines for a column of all memory cells that are in the array and are not column addressed during the write cycle of the array;
wherein the seventh voltage is lower than the eighth voltage.

9. The static random access memory (SRAM) of claim 3 wherein the latch in each memory cell of the array of memory cells comprises:

a first p-channel transistor, the first p-channel transistor having a gate, a drain and a source, wherein the source is connected to the latch sourcing supply line of the memory cell;
a second p-channel transistor, the second p-channel transistor having a gate, a drain and a source, wherein the source of the second p-channel transistor is connected to the latch sourcing supply line of the memory cell, wherein the gate of the first p-channel transistor is connected to the drain of the second p-channel transistor and the gate of the second p-channel transistor is connected to the drain of the first p-channel transistor;
a first n-channel transistor, the first n-channel transistor having a gate, a drain and a source, wherein the source of the first n-channel transistor is connected to the latch sinking supply line of the memory cell, the gate of the first n-channel transistor is connected to the gate of the first p-channel transistor, and the drain of the first n-channel transistor is connected to the drain of the first p-channel transistor; and
a second n-channel transistor, the second n-channel transistor having a gate, a drain and a source, wherein the source of the second n-channel transistor is connected to the latch sinking supply line of the memory cell, the gate of the second n-channel transistor is connected to the gate of the second p-channel transistor, and the drain of the second n-channel transistor is connected to the drain of the second PMOS transistor;
wherein each memory cell in the array further comprises:
a third n-channel transistor, the third n-channel transistor having a gate, a drain and a source, wherein the source of the third n-channel transistor is connected to the gate of the second p-channel transistor, the gate of the third n-channel transistor is connected to a write word line in the array, and the drain of the third n-channel transistor is connected to a first write bit line in the array; and
a fourth n-channel transistor, the fourth n-channel transistor having a gate, a drain and a source, wherein the source of the forth n-channel transistor is connected to the gate of the first p-channel transistor, the gate of the fourth n-channel transistor is connected to the write word line in the array, and the drain of the fourth n-channel transistor is connected to a second write bit line in the array;
wherein the at least one read buffer comprises:
a fifth n-channel transistor, the fifth n-channel transistor having a gate, a drain and a source, wherein the source of the fifth n-channel transistor is connected to a read sinking supply line and the gate of the fifth n-channel transistor is connected to the drain of the fourth n-channel transistor; and
a sixth n-channel transistor, the sixth n-channel transistor having a gate, a drain and a source, wherein the source of the sixth n-channel transistor is connected to the drain of the fifth n-channel transistor, the gate of the sixth n-channel transistor is connected to a read word line in the array, and the drain of the sixth n-channel transistor is connected to a read bit line in the array.

10. The static random access memory (SRAM) of claim 3 wherein a third voltage applied at the latch sourcing supply line for each column of memory cells in the array is substantially equal to a fourth voltage applied to an Nwell of each memory cell in the column; and
wherein a fifth voltage applied at the latch sinking supply line for each column of memory cells in the array is substantially equal to a sixth voltage applied to a Pwell of each memory cell in the column.

11. The static random access memory (SRAM) of claim 3 wherein each supply switch for the column of memory cells that are column addressed during the read cycle of the array electrically connects each memory cell in the column of memory cells that are column addressed during the read cycle of the array to a nominal voltage latch sourcing supply; wherein each power switch in the column of memory cells that are not column addressed during the read cycle of the array electrically connects each memory cell in the column of memory cells that are not column addressed during the read cycle of the array to a low voltage latch sourcing supply; and wherein the nominal voltage latch sourcing supply has a higher voltage than the voltage of the low voltage latch sourcing supply.

12. The semiconductor static random access memory (SRAM) of claim 3 wherein each of the supply switches comprises:
    a first transistor, the first transistor having a gate, a drain and a source, wherein the source of the first transistor is connected to a nominal voltage latch sourcing supply VDDN, wherein the gate of the first transistor is connected to receive a control signal, wherein the drain of the first transistor is connected to a latch sourcing supply line;
    a second transistor, the second transistor having a gate, a drain and a source, wherein the source of the second transistor is connected to a low power voltage latch sourcing supply VDDL, wherein the gate of the second transistor is connected to receive the inverse of the control signal, wherein the drain of the second transistor is connected to the drain of the first transistor;
    wherein the control signal is driven to a first logic value when a column containing the supply switch is column addressed during a read cycle of the array; and
    wherein the control signal is driven to a second logic value inverse to the first logic value when a column containing the supply switch is not column addressed during the read cycle of the array.

13. The semiconductor static random access memory (SRAM) of claim 3 wherein the supply switch comprises:
    a first transistor, the first transistor having a gate, a drain and a source, wherein the source of the first transistor is connected to a nominal voltage latch sourcing supply VDDN, wherein the gate of the first transistor is connected to receive a control signal, wherein the drain of the first transistor is connected to a latch sourcing supply line;
    a solid state device, the solid state device having a cathode and anode, wherein the anode of the solid state device is connected to VDDN and the cathode of the diode is connected to the latch sourcing supply line;
    wherein the control signal is driven to a first logic value when a column containing the supply switch is column addressed during the read cycle of the array; and
    wherein the control signal is driven to a second logic value inverse to the first logic value when a column containing the supply switch is not addressed during the read cycle of the array.

14. The static access memory (SRAM) of claim 13 where the solid state device is selected from a group of solid state devices consisting of a diode, an n-channel transistor configured as a diode and a p-channel transistor configured as a diode.

15. The static random access memory (SRAM) of claim 3 wherein each supply switch in the columns that are column addressed during the read cycle of the array electrically connects each memory cell in the columns that are column addressed during the read cycle of the array to a nominal voltage latch sinking supply; wherein each power switch in the columns that are not column addressed during the read cycle of the array electrically connects each memory cell in the columns that are not column addressed during the read cycle of the array to a high voltage latch sinking supply; wherein the nominal voltage latch sinking supply has a lower voltage than the voltage of the high voltage latch sinking supply.

16. The semiconductor static random access memory (SRAM) of claim 3 where in the supply switch comprises:
    a first transistor, the first transistor having a gate, a drain and a source, wherein the source of the first transistor is connected to a nominal voltage latch sinking supply VSSN, wherein the gate of the first transistor is connected to receive a control signal, wherein the drain of the first transistor is connected to a latch sinking supply line;
    a second transistor, the second transistor having a gate, a drain and a source, wherein the source of the second transistor is connected to a high power voltage latch sinking supply VSSH, wherein the gate of the second transistor is connected to receive the inverse of the control signal, wherein the drain of the second transistor is connected to the drain of the first transistor;
    wherein the control signal is driven to a first logic value when a column containing the supply switch is column addressed during the read cycle of the array;
    wherein the control signal is driven to a second logic value inverse to the first logic value when a column containing the supply switch is not column addressed during the read cycle of the array.

17. The semiconductor static random access memory (SRAM) of claim 3 wherein the supply switch comprises:
    a first transistor, the first transistor having a gate, a drain and a source, wherein the source of the first transistor is connected to a nominal voltage latch sinking supply VSSN, wherein the gate of the first transistor is connected to receive a control signal, wherein the drain of the first transistor is connected to a latch sinking supply line;
    a solid state device, the solid state device having a cathode and anode, wherein the anode of the solid state device is connected to the latch sinking supply line and the cathode of the diode is connected to VSS;
    wherein the control signal is driven to a first logic value when a column containing the supply switch is column addressed during the read cycle of the array;
    wherein the control signal is driven to a second logic value inverse to the first logic value when a column containing the supply switch is not column addressed during the read cycle of the array.

18. The static access memory (SRAM) of claim 17 where the solid state device is selected from a group of solid state devices consisting of a diode, an n-channel transistor configured as a diode and a p-channel transistor configured as a diode.

19. A static random access memory (SRAM) in an integrated circuit, comprising:
    an array of memory cells arranged in rows and columns, each row of the memory cells connected to a word line and each column of the memory cells connected to a bit line, a latch sourcing supply line, and a latch sinking supply line; and
    a plurality of supply switches, each connected to a latch sourcing or a latch sinking supply line for one of the columns;

wherein each memory cell in the array comprises a latch connected between a latch sourcing supply line and a latch sinking supply line;

wherein each column of memory cells is connected to one of the plurality of supply switches;

wherein a first voltage is applied between latch sourcing and latch sinking supply lines for a column of memory cells that are in the array and are column addressed during a read cycle of the array;

wherein a second voltage is applied between latch sourcing and latch sinking supply lines for a column of memory cells that are in the array and are not column addressed during the read cycle of the array;

wherein the first voltage is greater than the second voltage;

wherein a third voltage is applied between latch sourcing and latch sinking supply lines for a column of memory cells that are in the array and are column addressed during a write cycle of the array;

wherein a fourth voltage is applied between latch sourcing and latch sinking supply lines for a column of all memory cells that are in the array and are not column addressed during the write cycle of the array; and wherein the third voltage is lower than the fourth voltage.

20. The static random access memory (SRAM) of claim 19, wherein the second voltage is equal to a nominal voltage and the first voltage is equal to a high voltage.

21. The static random access memory (SRAM) of claim 19, wherein a fifth voltage applied to the latch sourcing supply line for a column of memory cells that are in the array and are column addressed during the read cycle of the array is higher than a sixth voltage applied to the latch sourcing supply line for a column of memory cells that are in the array and are not column addressed during the read cycle of the array.

22. The static random access memory (SRAM) of claim 19, wherein a seventh voltage applied to the latch sinking supply line for a column of memory cells that are in the array and are column addressed during the read cycle of the array is lower than an eighth voltage applied to the latch sinking supply line for a column of memory cells that are in the array and are not column addressed during the read cycle of the array.

23. The static random access memory (SRAM) of claim 19 wherein the latch in each of the array of memory cells comprises:

a first p-channel transistor, the first p-channel transistor having a gate, a drain and a source, wherein the source is connected to the latch sourcing supply line of the memory cell;

a second p-channel transistor, the second p-channel transistor having a gate, a drain and a source, wherein the source of the second p-channel transistor is connected to the latch sourcing supply line of the memory cell, wherein the gate of the first p-channel transistor is connected to the drain of the second p-channel transistor and the gate of the second p-channel transistor is connected to the drain of the first p-channel transistor;

a first n-channel transistor, the first n-channel transistor having a gate, a drain and a source, wherein the source of the first n-channel transistor is connected to the latch sinking supply line of the memory cell, the gate of the first n-channel transistor is connected to the gate of the first p-channel transistor, and the drain of the first n-channel transistor is connected to the drain of the first p-channel transistor; and a second n-channel transistor, the second n-channel transistor having a gate, a drain and a source, wherein the source of the second n-channel transistor is connected to the latch sinking supply line of the memory cell, the gate of the second n-channel transistor is connected to the gate of the second p-channel transistor, and the drain of the second n-channel transistor is connected to the drain of the second p-channel transistor;

wherein each memory cell in the array further comprises:

a third n-channel transistor, the third n-channel transistor having a gate, a drain and a source, wherein the source of the third n-channel transistor is connected to the gate of the second p-channel transistor, the gate of the third n-channel transistor is connected to a word line in the SRAM, and the drain of the third n-channel transistor is connected to a first bit line in the SRAM; and a fourth n-channel transistor, the fourth n-channel transistor having a gate, a drain and a source, wherein the source of the forth n-channel transistor is connected to the gate of the first p-channel transistor, the gate of the fourth n-channel transistor is connected to the word line in the SRAM, and the drain of the fourth n-channel transistor is connected to a second bit line in the SRAM.

24. A supply switch in an integrated circuit, the supply switch operable to supply a voltage to an array of memory cells in the integrated circuit, the supply switch comprising:

a first transistor having a gate operable to receive a first supply selection signal, having a source connected to a first supply voltage and having a drain connected to the array;

a second transistor having a gate operable to receive a second supply selection signal, having a source connected to a second supply voltage and having a drain connected to the array, the second supply voltage being different from the first supply voltage; and a solid state device connected to the array and operable to supply the array with a third supply voltage that is different from each of the first and second supply voltages.

25. The supply switch of claim 24, wherein each of the first and second transistors is a p-channel transistor.

26. The supply switch of claim 24, wherein the solid state device is a third transistor having a gate operable to receive a third supply selection signal, having a source connected to a third supply voltage and having a drain connected to the array, wherein the third supply voltage is different from each of the first and second supply voltages.

27. The supply switch of claim 24, wherein the solid state device is connected between the second supply voltage and the array, and wherein the solid state device is selected from a group of solid state devices consisting of a diode, an n-channel transistor configured as a diode and a p-channel transistor configured as a diode.

* * * * *